United States Patent
Kim et al.

(10) Patent No.: US 12,243,854 B2
(45) Date of Patent: Mar. 4, 2025

(54) ASSEMBLY SUBSTRATE STRUCTURE OF SEMICONDUCTOR LIGHT EMITTING DEVICE AND DISPLAY DEVICE INCLUDING THE SAME

(71) Applicant: LG ELECTRONICS INC., Seoul (KR)

(72) Inventors: Myoungsoo Kim, Seoul (KR); Changseo Park, Seoul (KR); Gunho Kim, Seoul (KR); Minwoo Lee, Seoul (KR); Jungsub Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 493 days.

(21) Appl. No.: 17/736,812

(22) Filed: May 4, 2022

(65) Prior Publication Data
US 2023/0060259 A1    Mar. 2, 2023

(30) Foreign Application Priority Data

Sep. 1, 2021   (KR) .................. 10-2021-0116290

(51) Int. Cl.
*H01L 25/075* (2006.01)
*H01L 33/38* (2010.01)

(52) U.S. Cl.
CPC .......... *H01L 25/0756* (2013.01); *H01L 33/38* (2013.01)

(58) Field of Classification Search
CPC ................. H01L 25/0756; H01L 33/38; H01L 2224/95101; H01L 33/62; H01L 25/0753
See application file for complete search history.

(56) References Cited

U.S. PATENT DOCUMENTS

| | | | |
|---|---|---|---|
| 9,825,202 B2 | 11/2017 | Schuele et al. | |
| 2015/0093860 A1 | 4/2015 | Hamby et al. | |
| 2022/0140194 A1* | 5/2022 | Song ................ | H01L 27/156 257/40 |

FOREIGN PATENT DOCUMENTS

| | | |
|---|---|---|
| KR | 10-2018-0030454 A | 3/2018 |
| KR | 10-2019-0143840 A | 12/2019 |
| KR | 10-2145193 B1 | 8/2020 |
| KR | 10-2205693 B1 | 1/2021 |

* cited by examiner

*Primary Examiner* — Karen Kusumakar
*Assistant Examiner* — Shawn Shaw Muslim
(74) *Attorney, Agent, or Firm* — Birch, Stewart, Kolasch & Birch, LLP

(57) ABSTRACT

An overlapping assembly substrate structure for semiconductor light emitting devices, includes a first assembly substrate structure and a second assembly substrate structure disposed spaced apart from each other. The first assembly substrate structure can include a first electrode and a second electrode spaced apart by a first distance and a first partition wall having a circular first assembly hole to accommodate a semiconductor light emitting device having a circular shape. Further, the second assembly substrate structure can include a third electrode and a fourth electrode spaced apart by a second distance greater than the first distance and a second partition wall having an elliptical second assembly hole to accommodate a semiconductor light emitting device having an elliptical shape.

20 Claims, 30 Drawing Sheets

[FIG. 1]
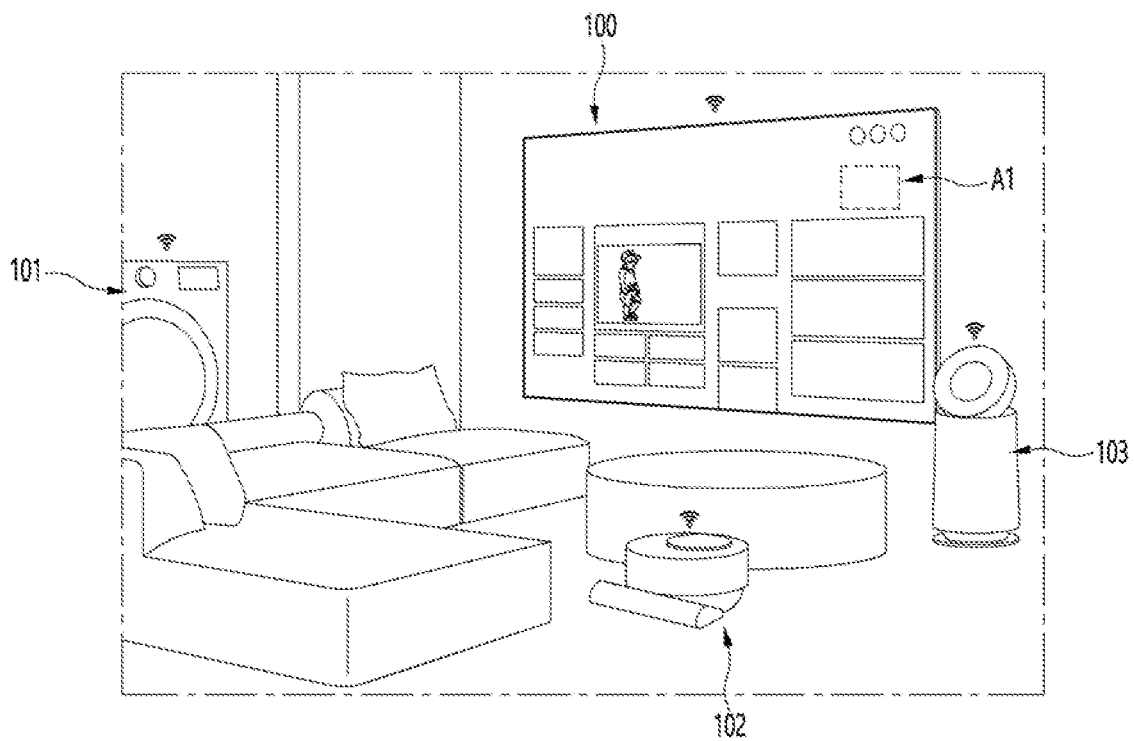

[FIG. 2]
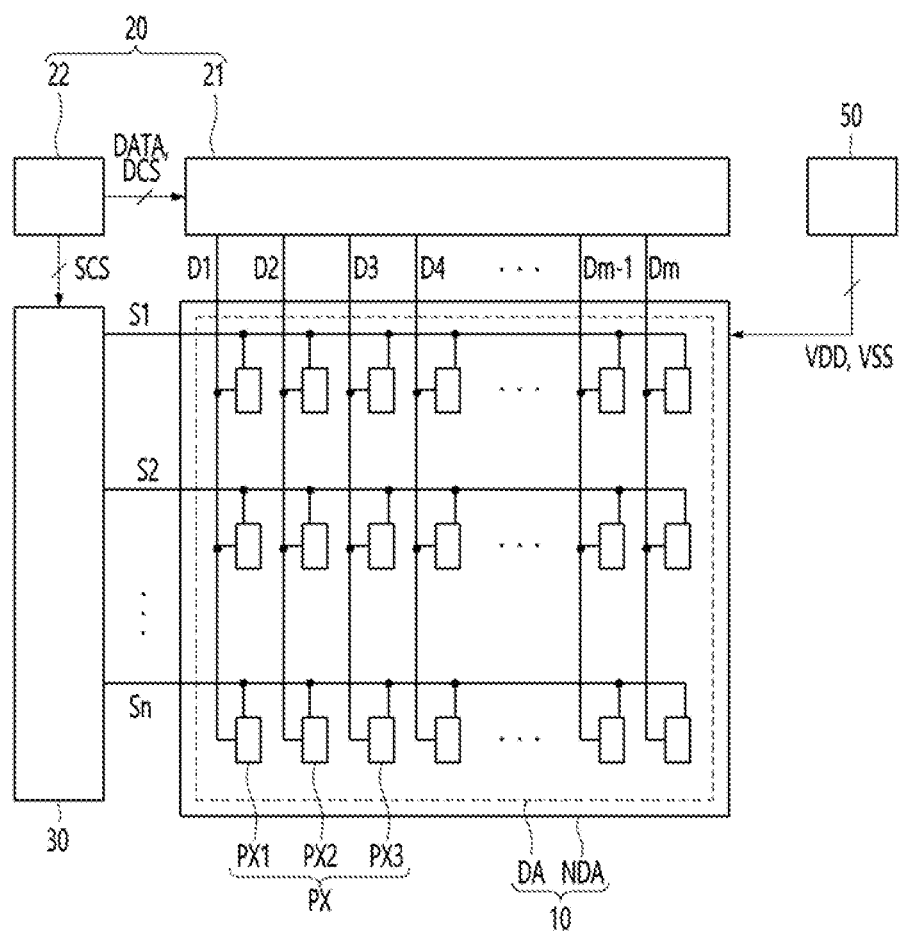

[FIG. 3]
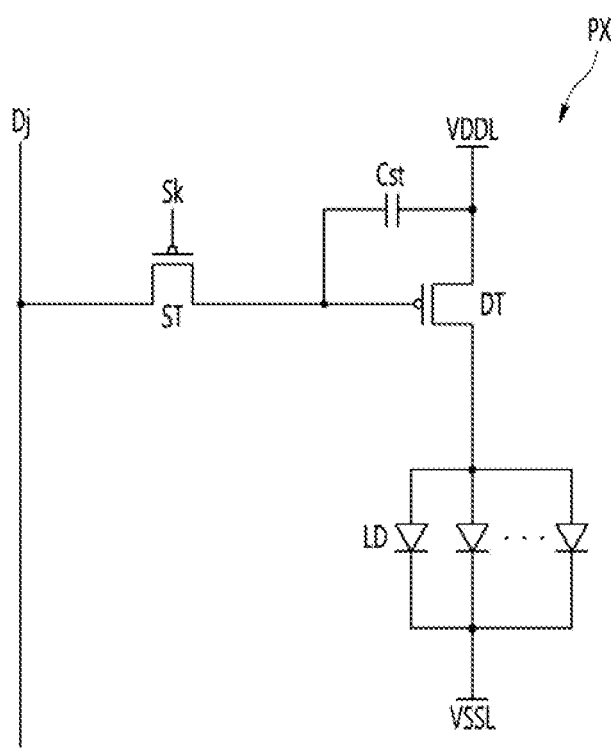

[FIG. 4]
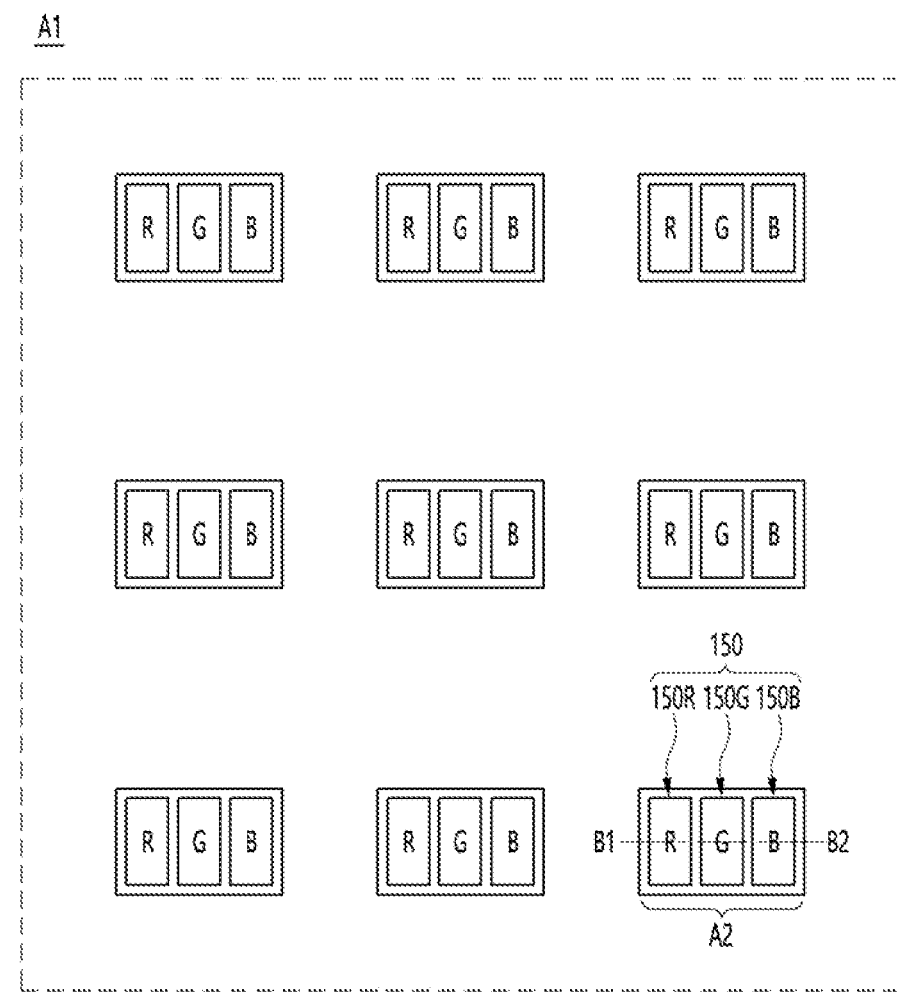

[FIG. 5]
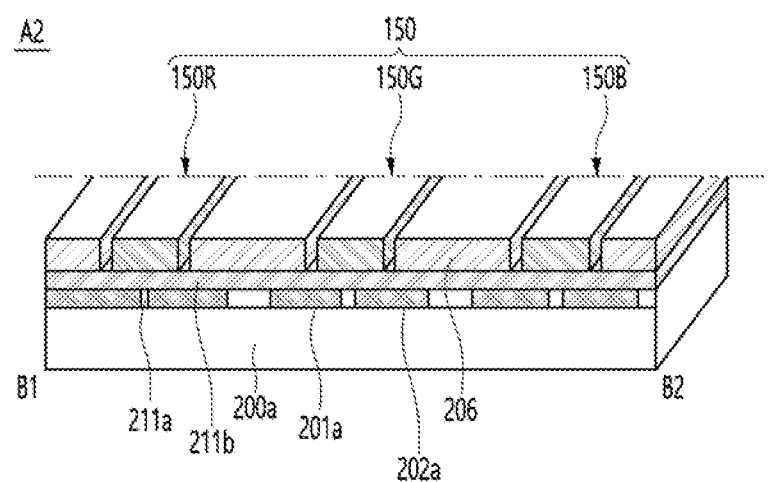
[FIG. 6]
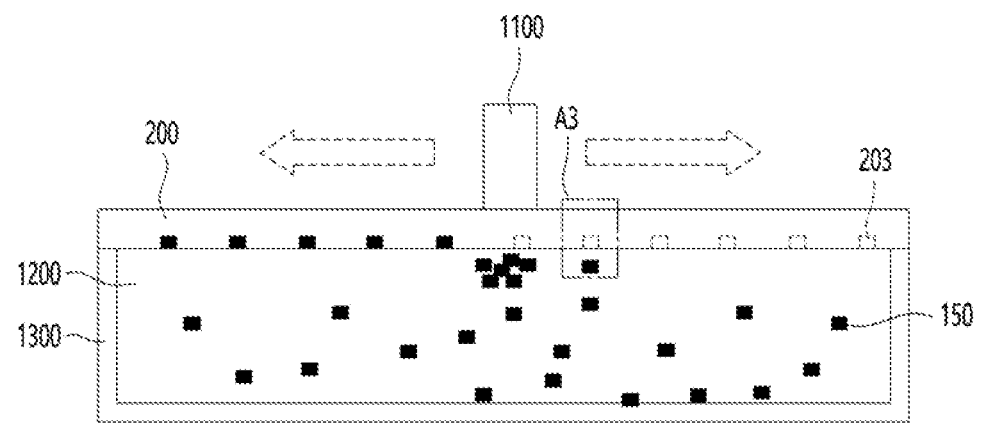

[FIG. 7]
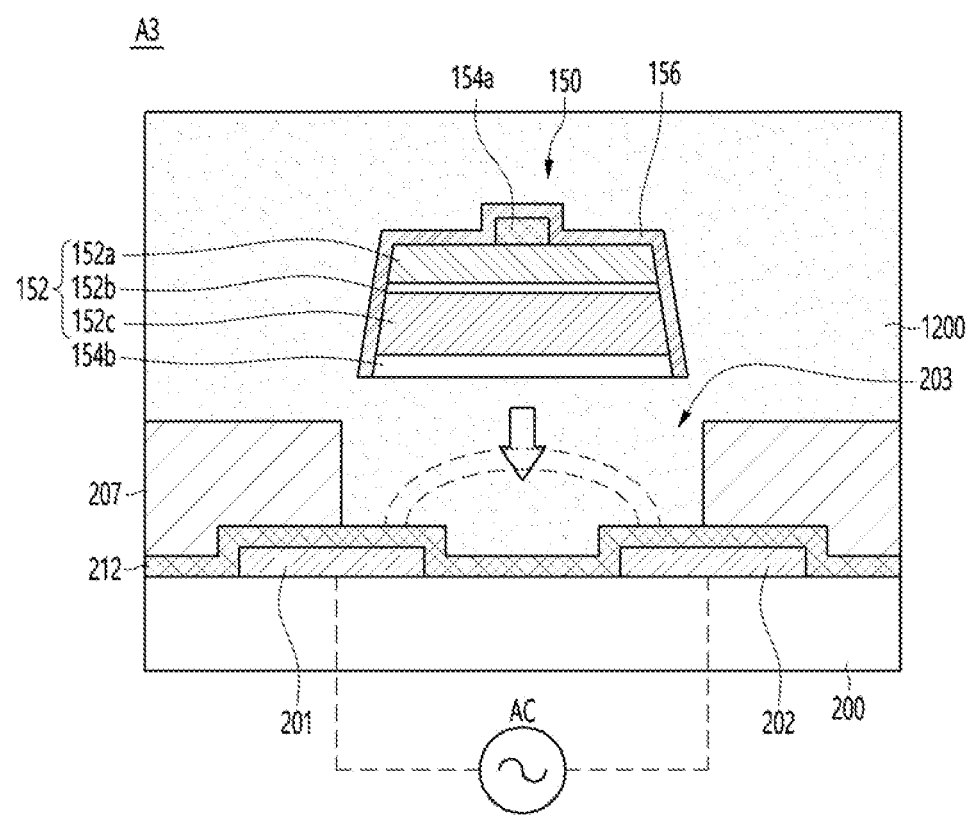

[FIG. 8A]
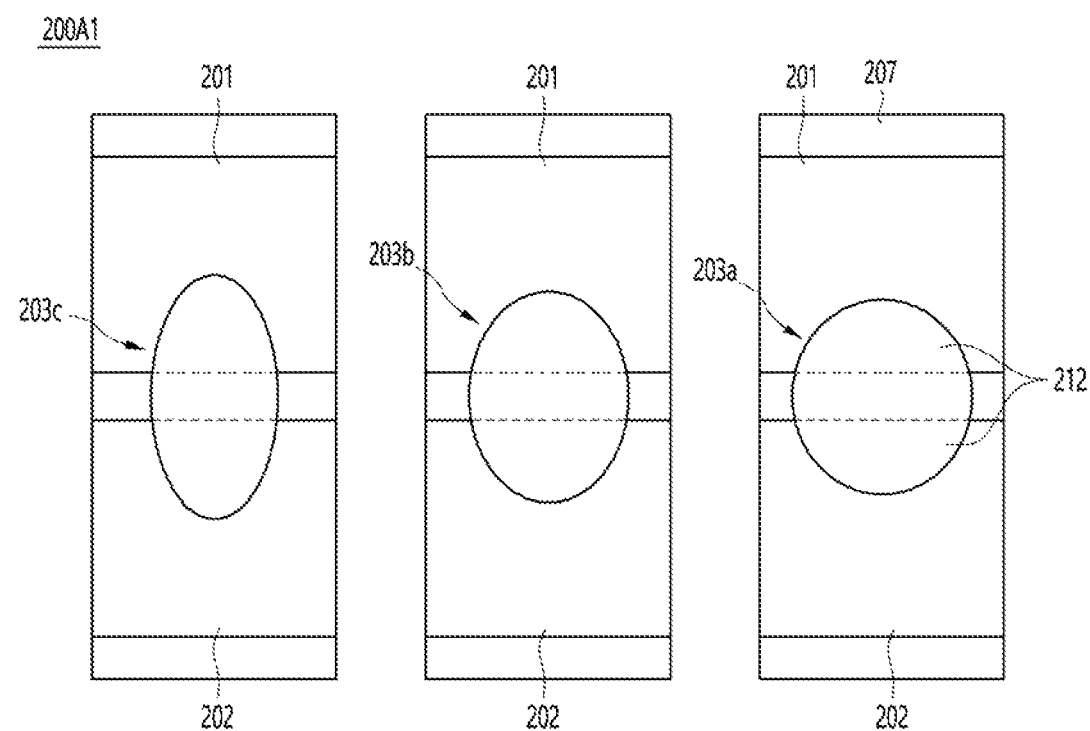

【FIG. 8B】
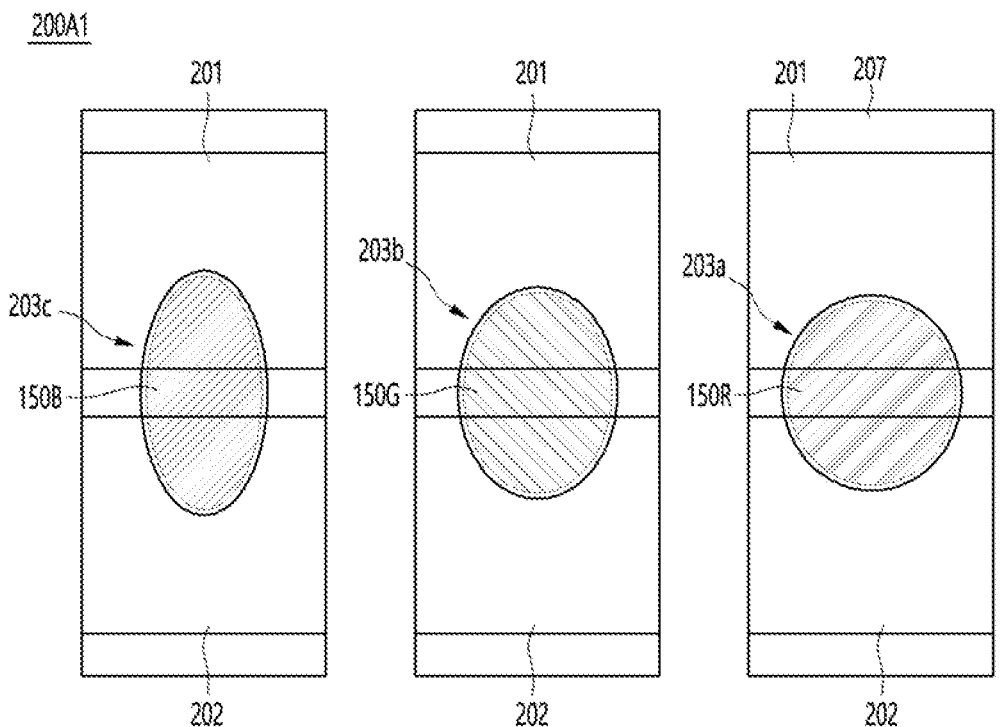
【FIG. 8C】
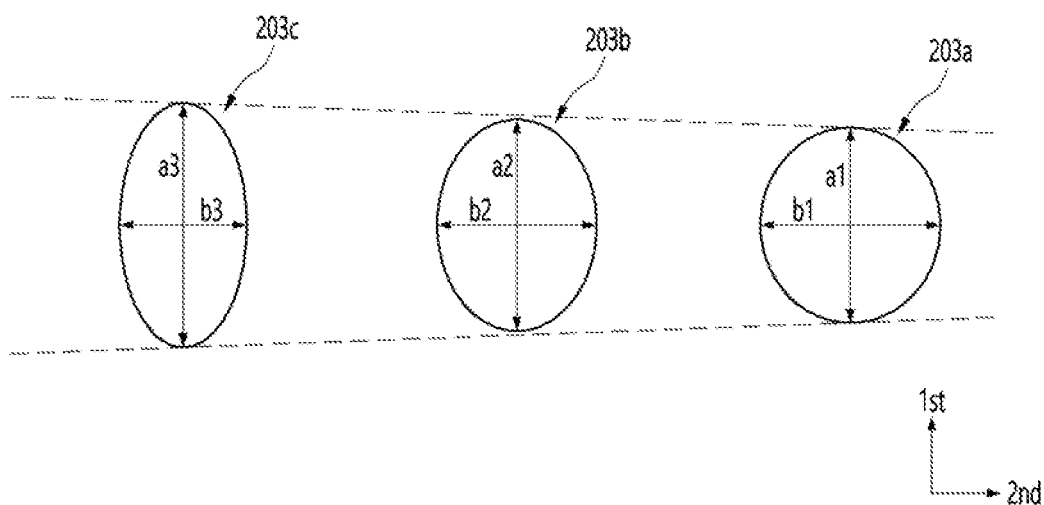

[FIG. 9A]
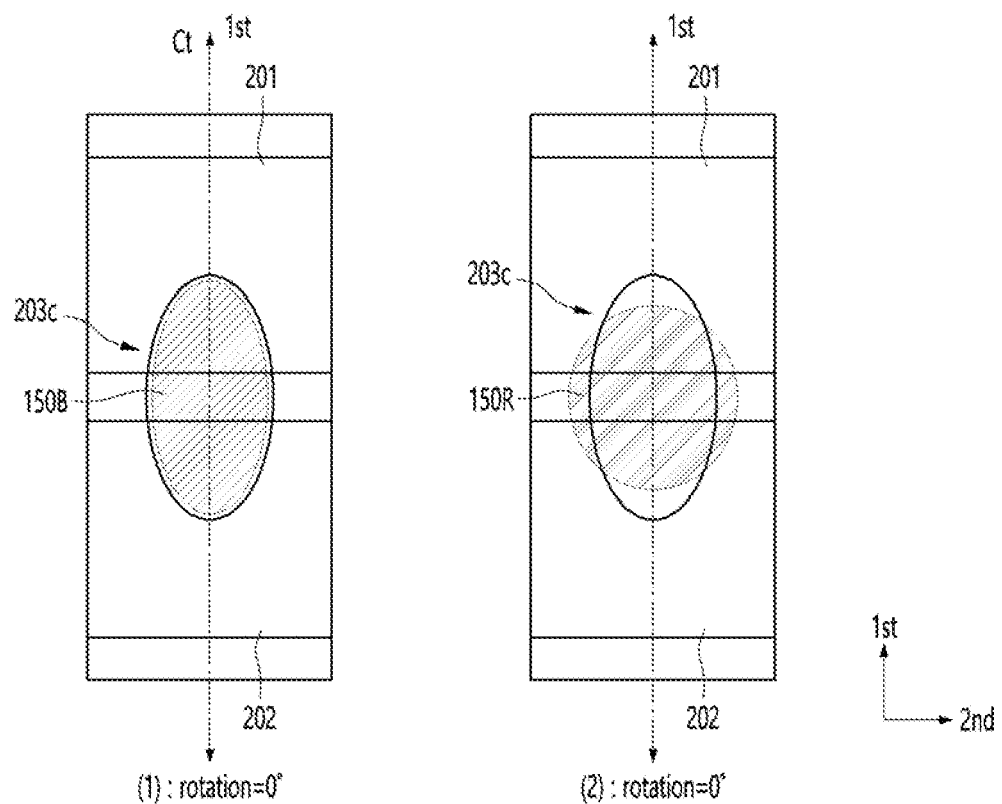

[FIG. 9B]
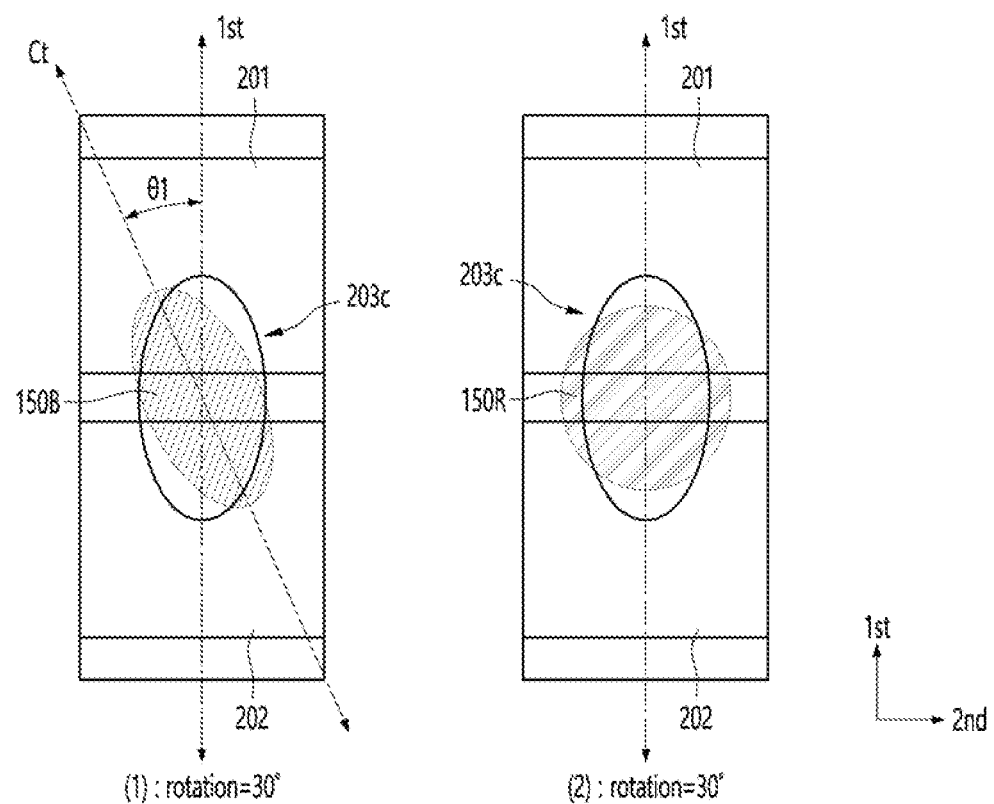

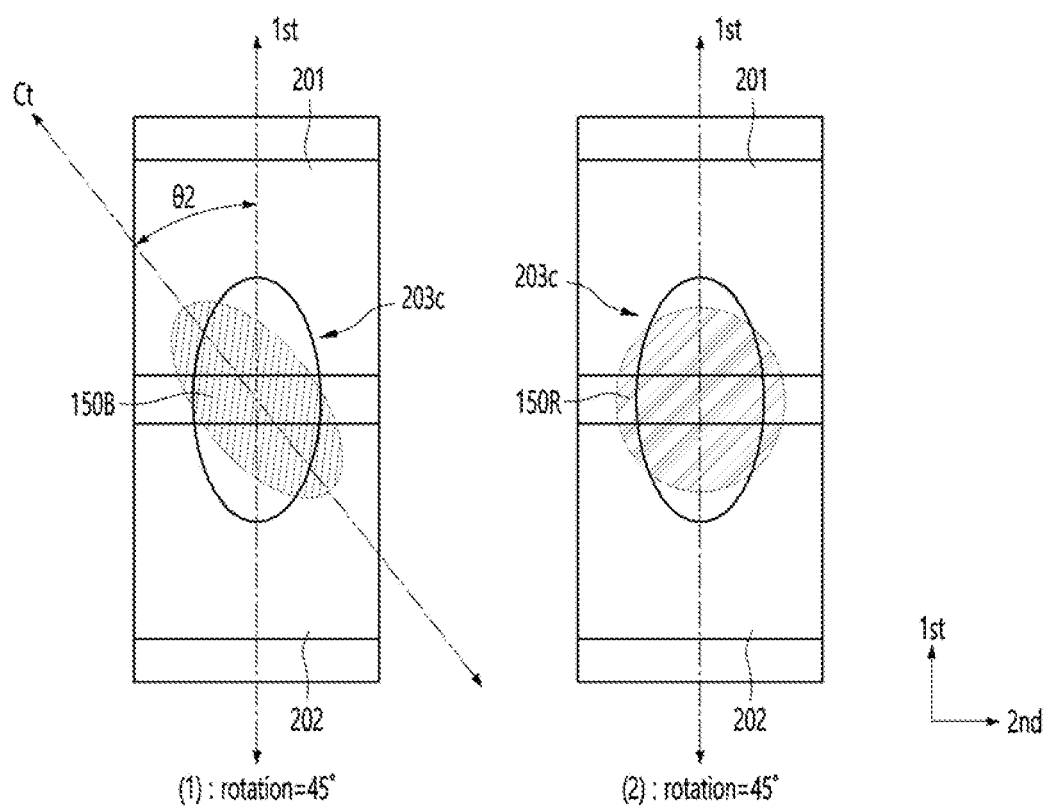
[FIG. 9C]

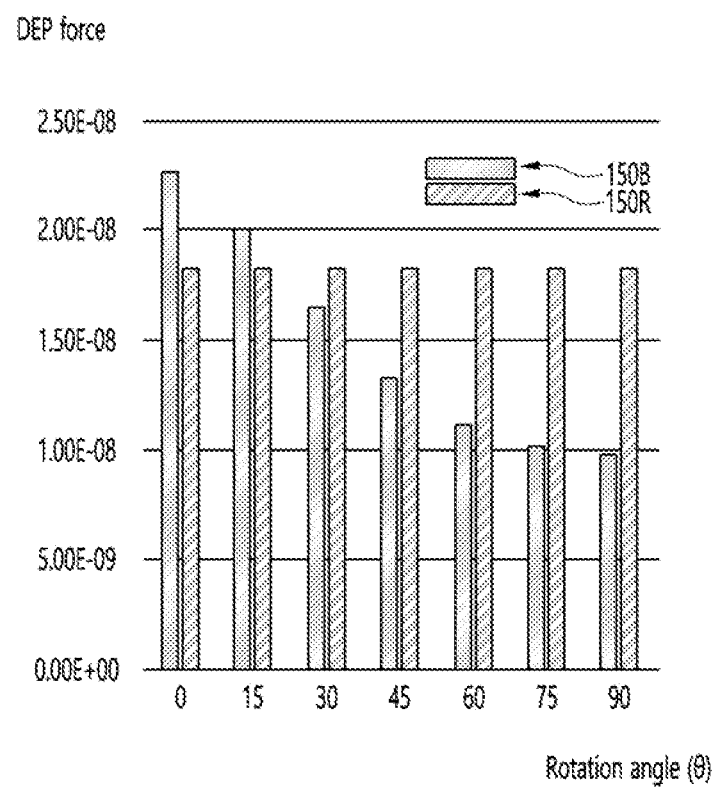
[FIG. 10A]

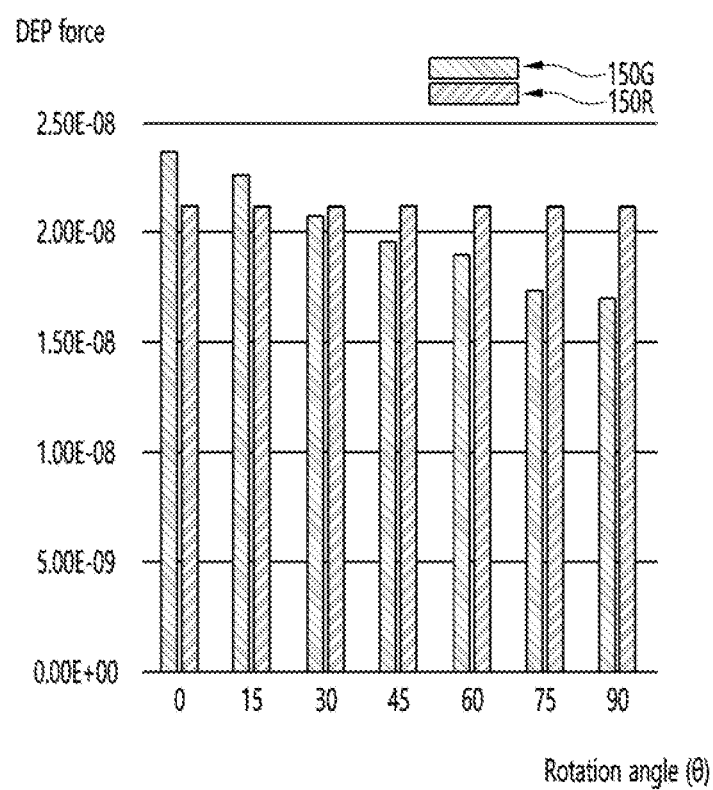
[FIG. 10B]

[FIG. 11A]
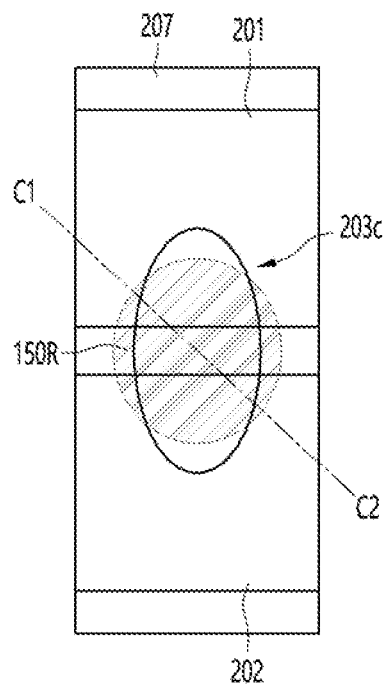
[FIG. 11B]
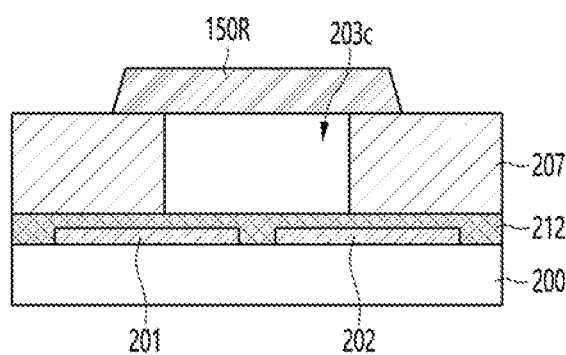

[FIG. 12A]
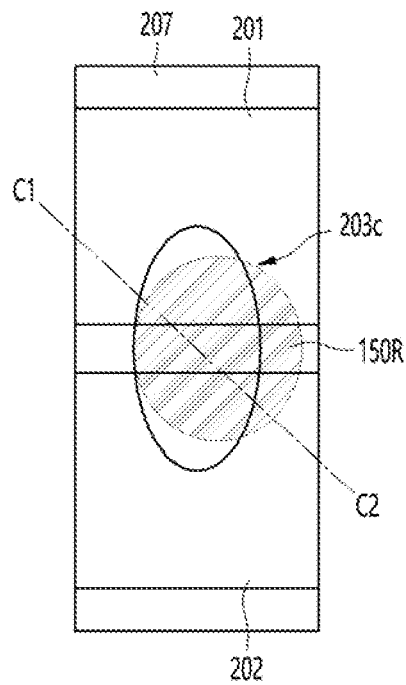
[FIG. 12B]
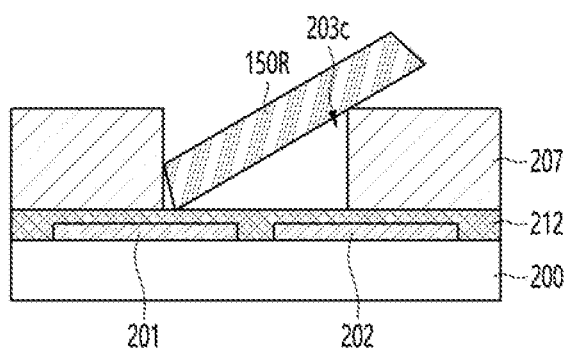

[FIG. 13A]
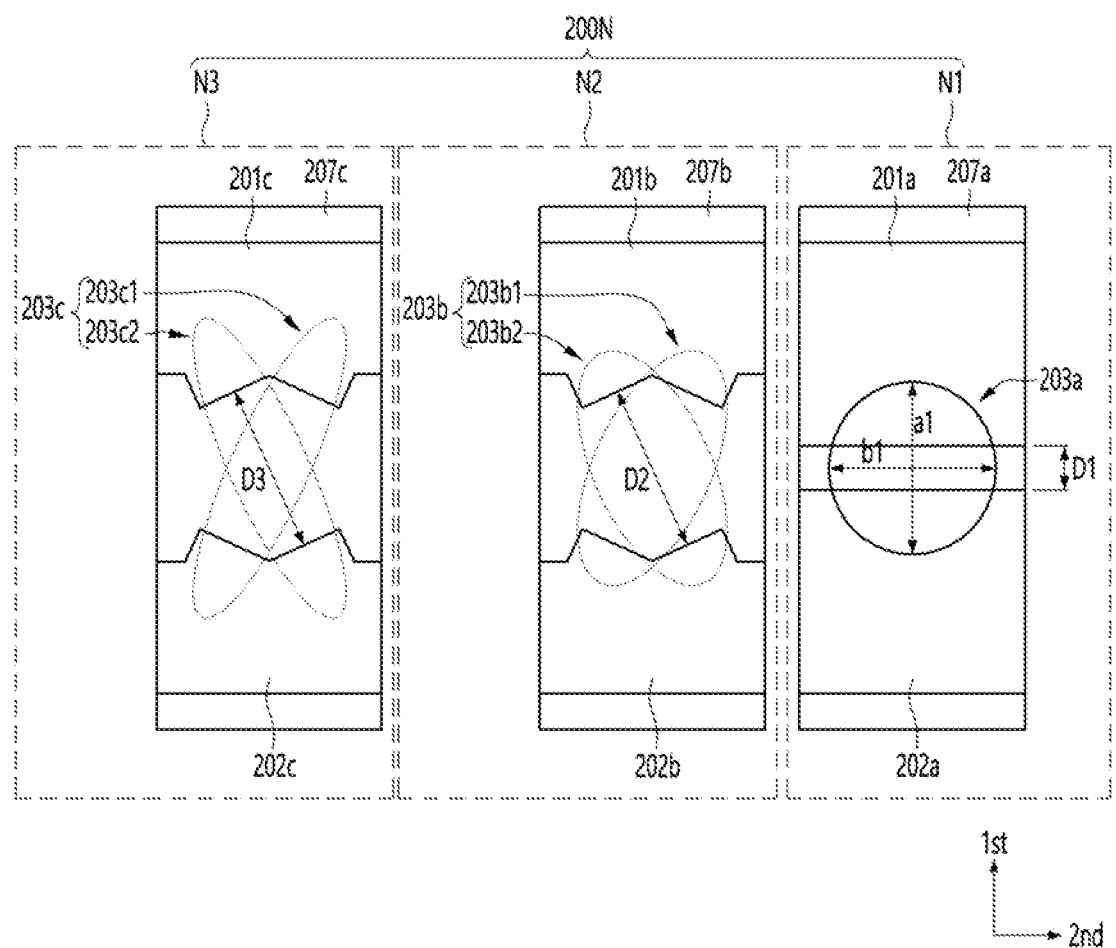

[FIG. 13B]
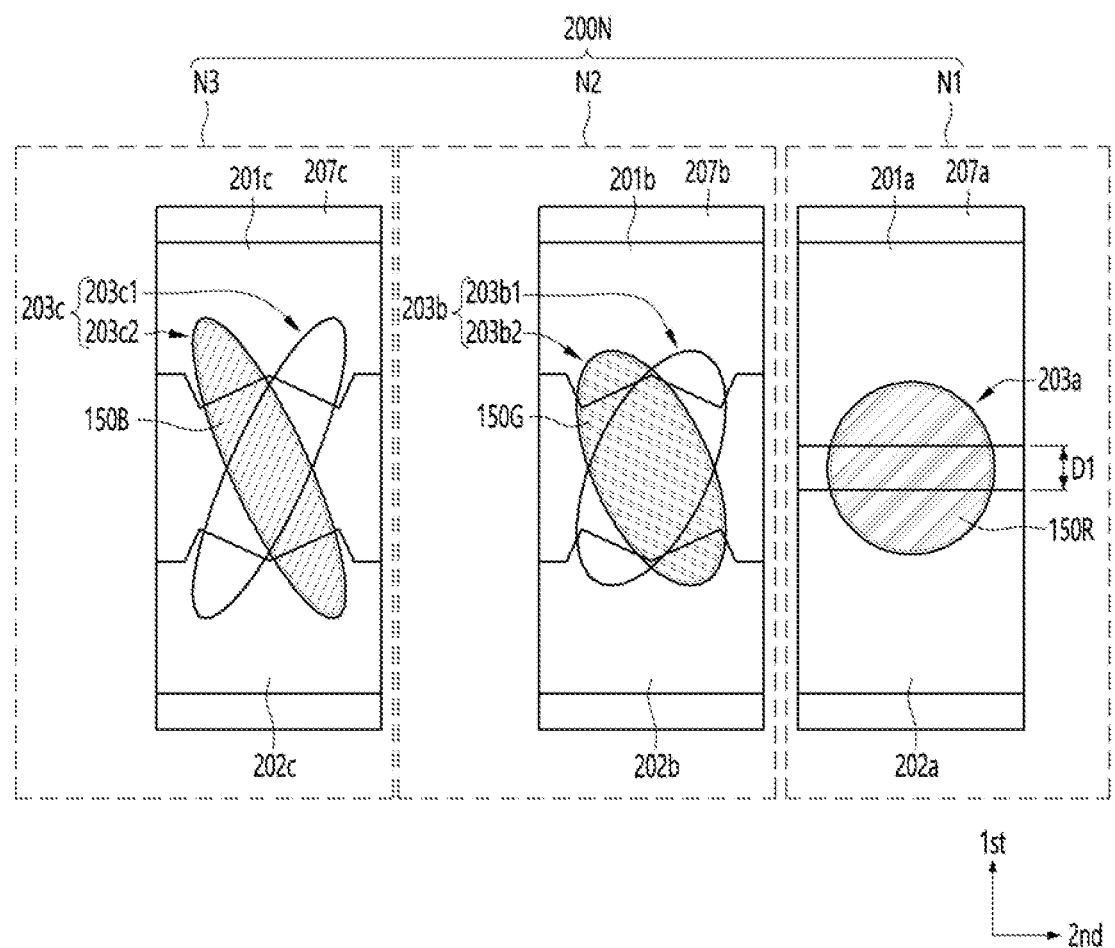

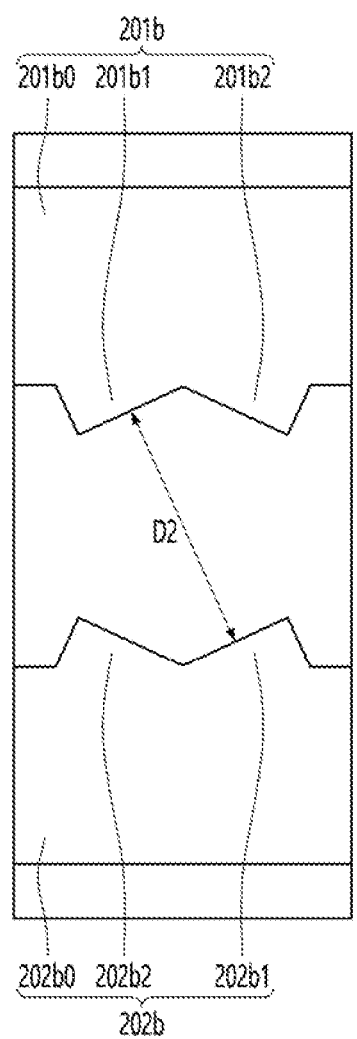
[FIG. 14A]

[FIG. 14B]
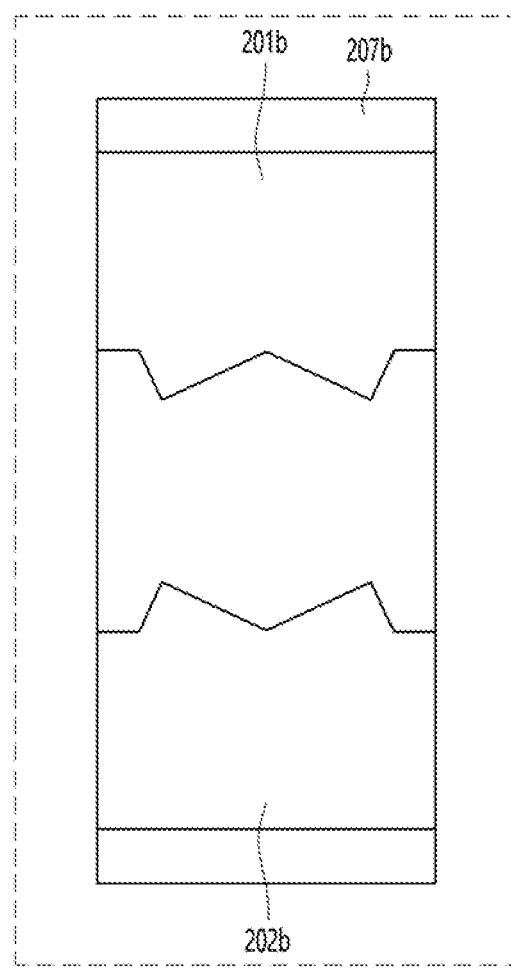

[FIG. 14C]
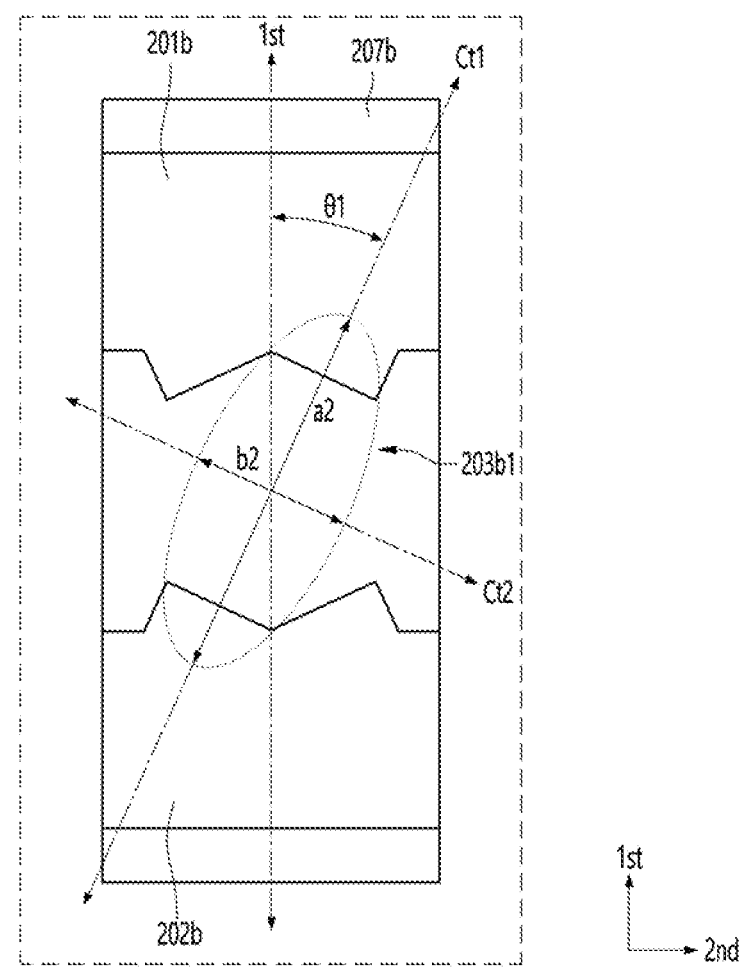

[FIG. 14D]
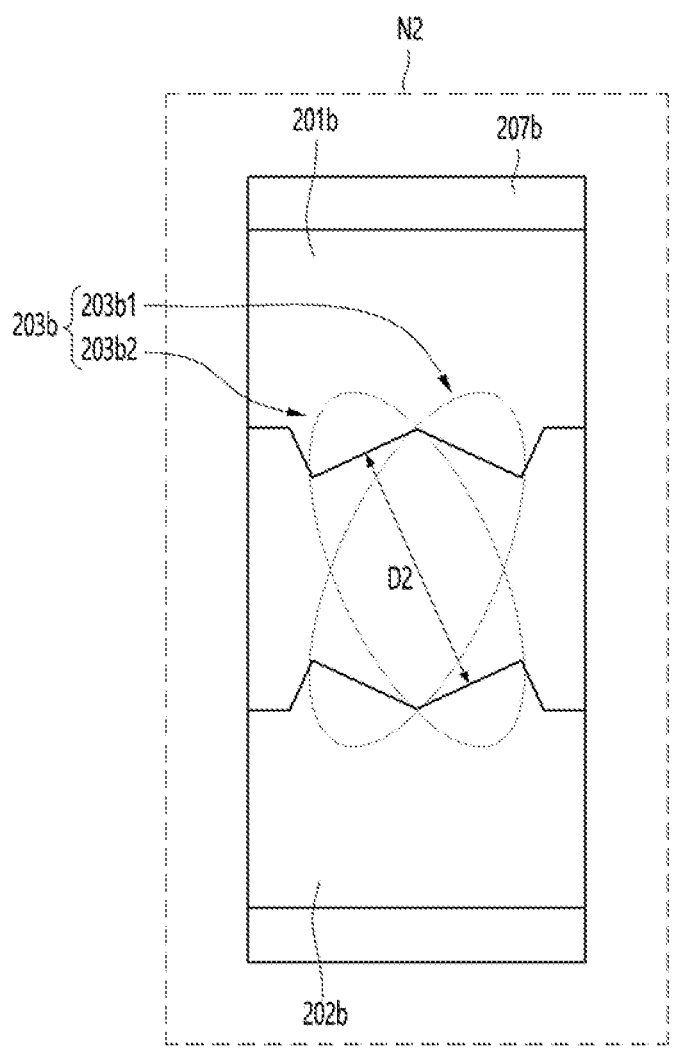

[FIG. 15A]
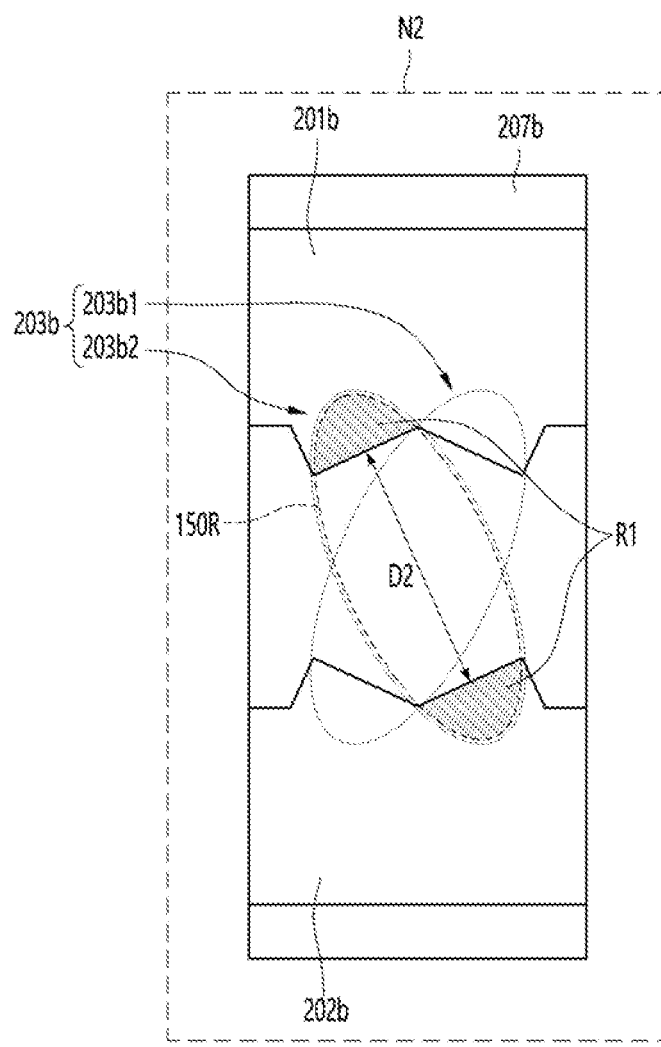

[FIG. 15B]
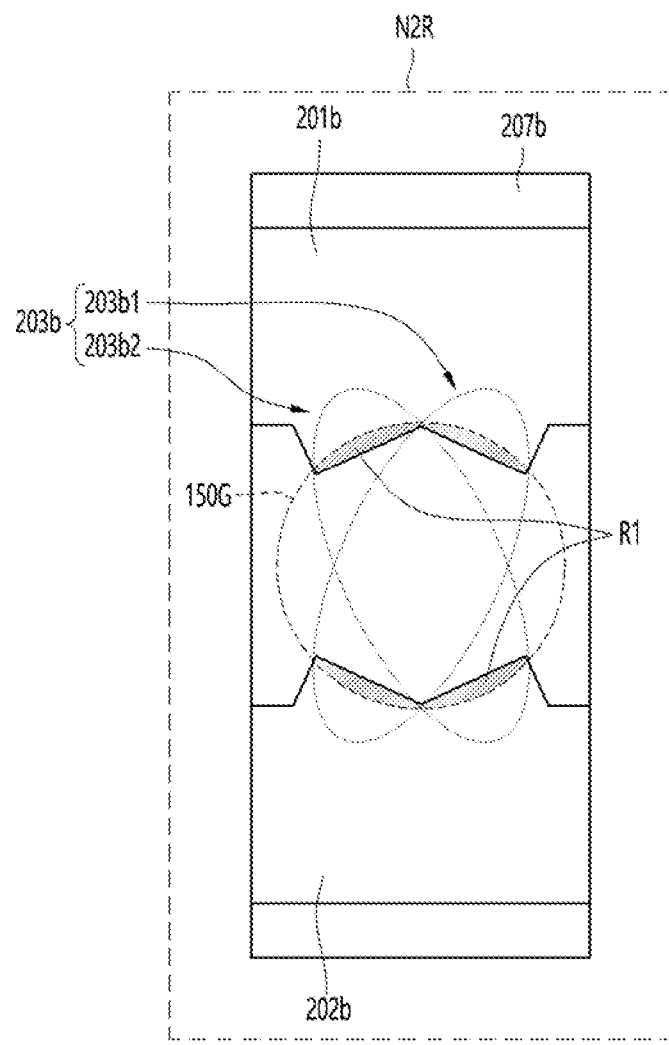

[FIG. 16]
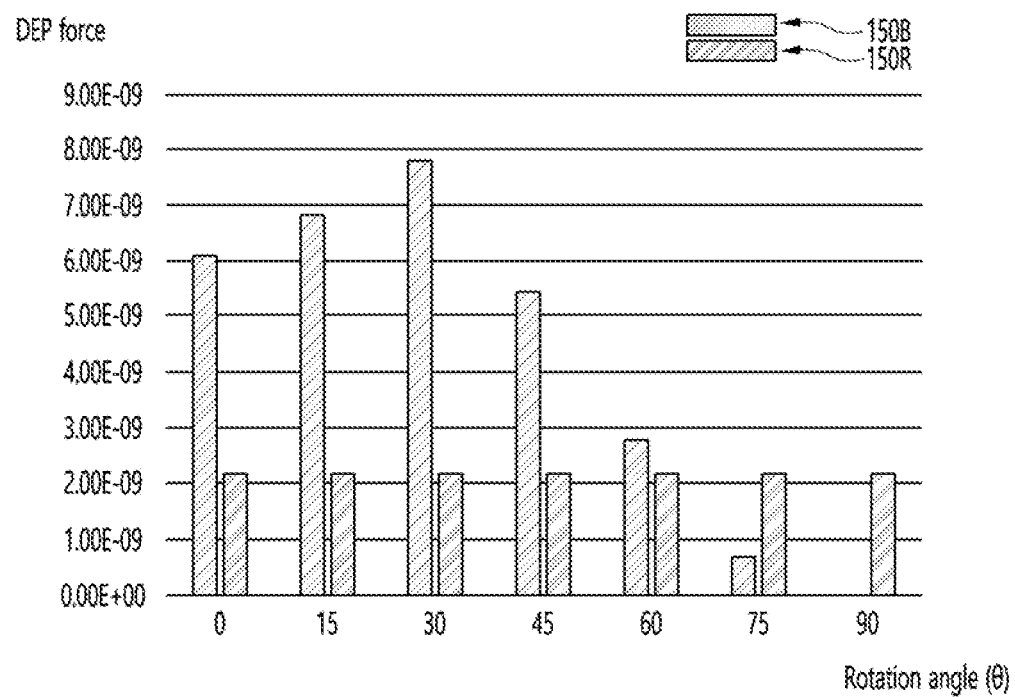

[FIG. 17A]
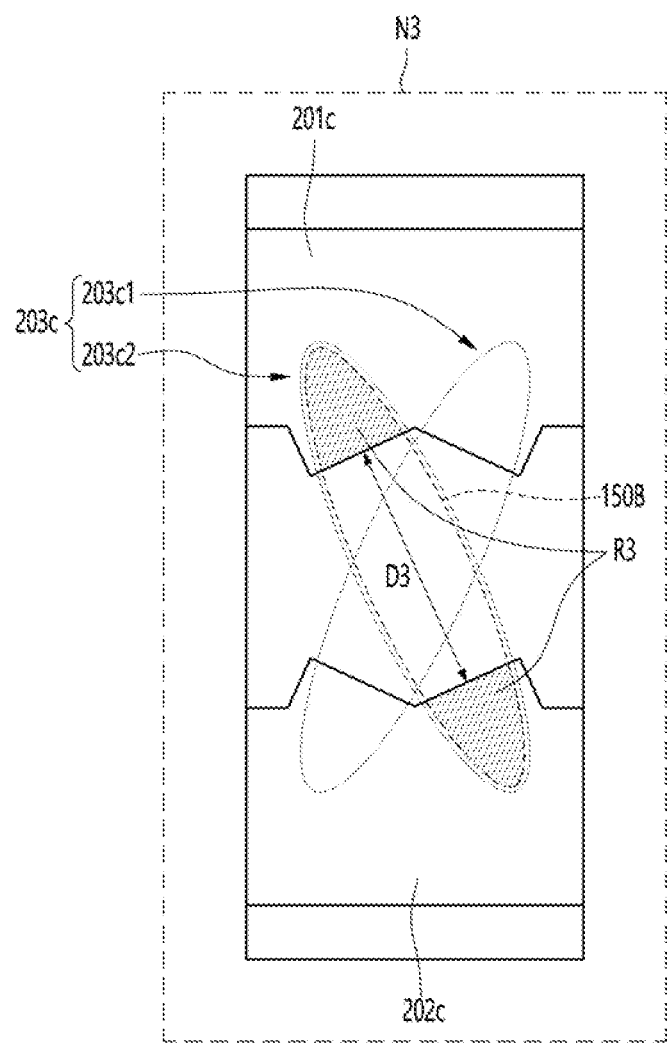

[FIG. 17B]
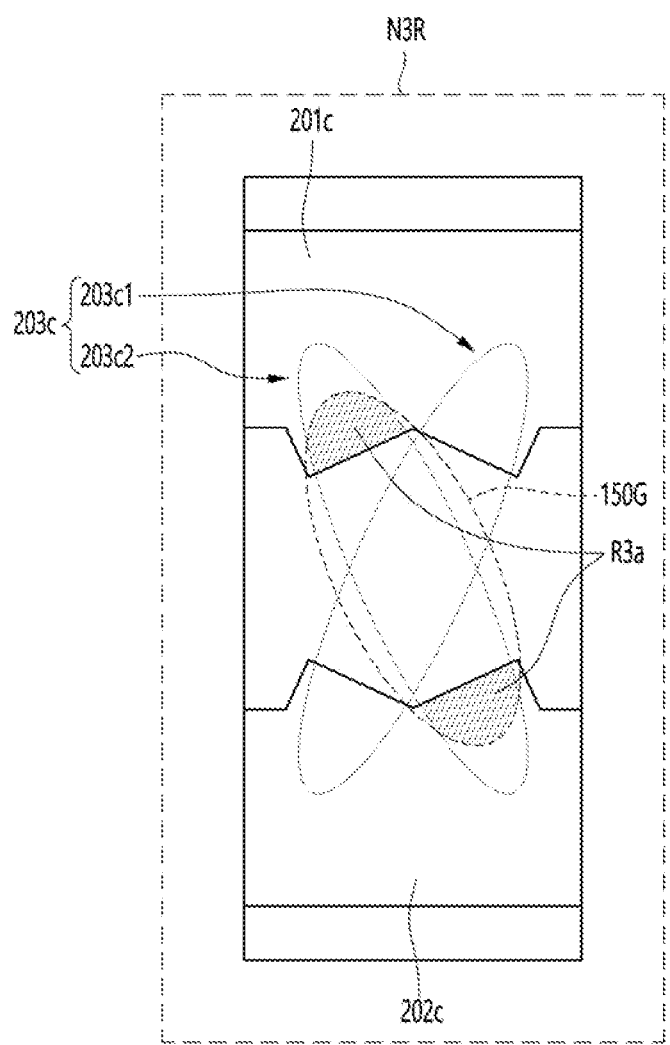

[FIG. 18A]
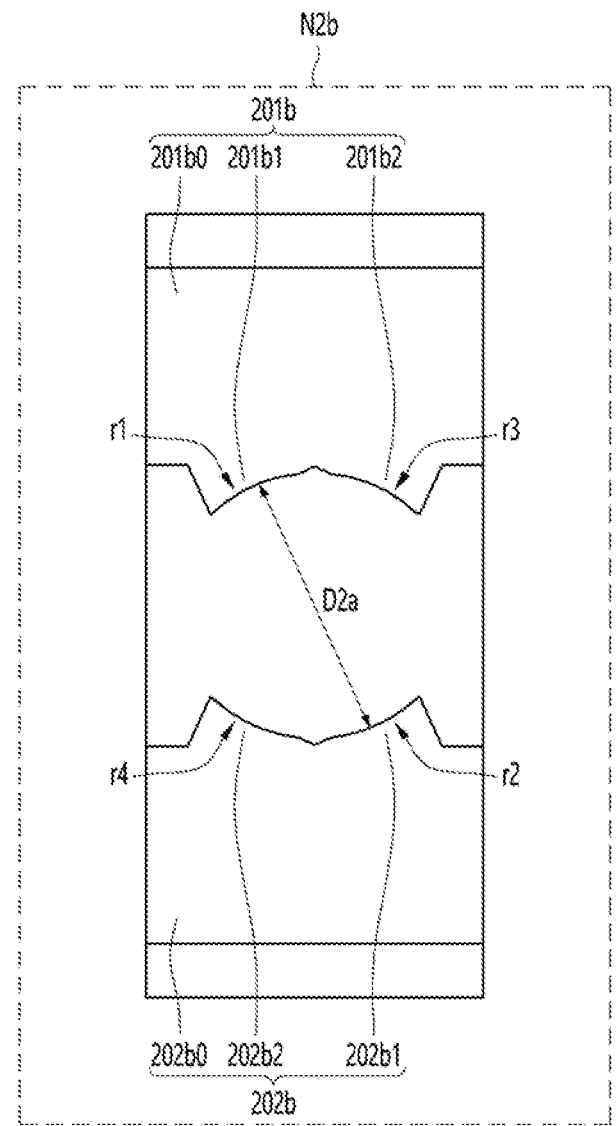

[FIG. 18B]
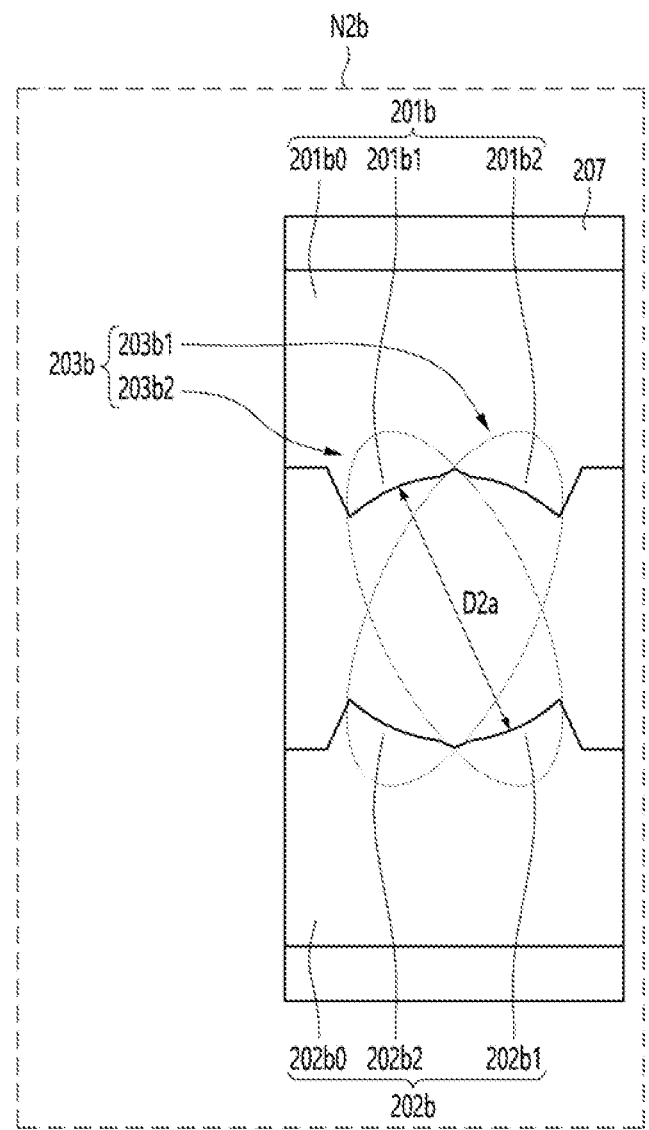

[FIG. 19A]
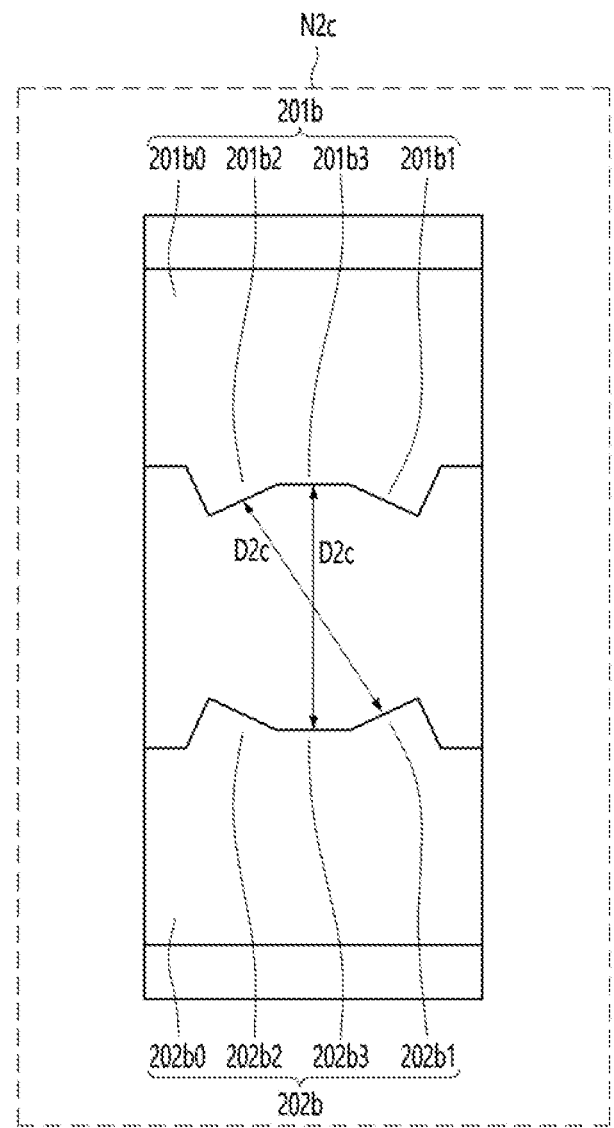

[FIG. 19B]
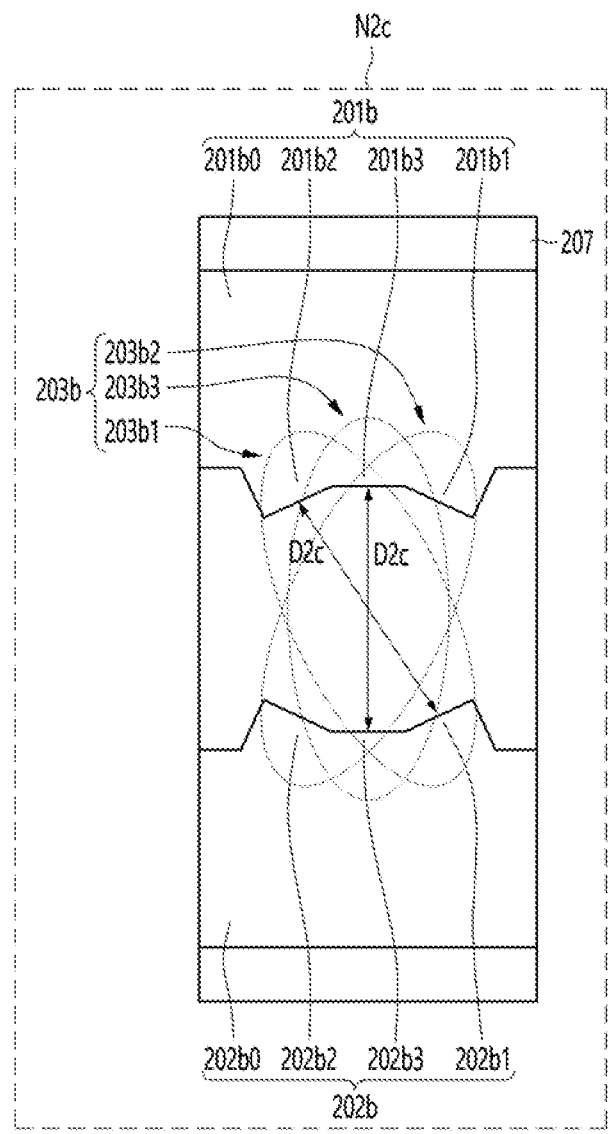

ASSEMBLY SUBSTRATE STRUCTURE OF SEMICONDUCTOR LIGHT EMITTING DEVICE AND DISPLAY DEVICE INCLUDING THE SAME

CROSS-REFERENCE TO RELATED APPLICATIONS

Pursuant to 35 U.S.C. § 119(a), this application claims the benefit of the earlier filing date and the right of priority to Korean Application No. 10-2021-0116290, filed on Sep. 1, 2021, the entire contents of which are expressly incorporated by reference into the present application.

BACKGROUND OF THE INVENTION

1. Technical Field

The embodiment relates to an assembly substrate structure of a semiconductor light emitting device and a display device including the same. Specifically, the embodiment relates to an assembly substrate structure of a semiconductor light emitting device for a display panel and a display device including the same.

2. Description of the Related Art

Large-scale displays include liquid crystal displays (LCDs), OLED displays, and micro-LED displays.

A micro-LED display is a display using a micro-LED, which is a semiconductor light emitting device having a diameter or cross-sectional area of 00 μm or less, as a display device.

Micro-LED display has excellent performance in many characteristics such as contrast ratio, response speed, color gamut, viewing angle, brightness, resolution, lifespan, luminous efficiency and luminance, because micro-LED, a semiconductor light emitting device, is used as a display device.

In particular, the micro-LED display has the advantage of being able to separate and combine the screens in a modular way, so that the size or resolution can be freely adjusted and the flexible display can be implemented.

However, since large-scale micro-LED displays require millions of micro-LEDs, there is a technical problem in that it is difficult to quickly and accurately transfer micro-LEDs to a display panel.

Transfer technologies that have been recently developed include a pick and place process, a laser lift-off method, or a self-assembly method.

Among them, the self-assembly method is a method in which a semiconductor light emitting device finds an assembly position in a fluid by itself, and is advantageous for realization of a large-screen display device.

Recently, although a micro-LED structure suitable for self-assembly has been proposed in U.S. Pat. No. 9,825,202, etc., research on a technology for manufacturing a display through self-assembly of micro-LED is still insufficient.

In particular, in the case of rapidly transferring millions of semiconductor light emitting devices to a large display in the related art, there is a technical problem in that the transfer speed can be improved, but the transfer error rate can be high, so that the transfer yield is lowered.

Although a transfer process using a self-assembly method using dielectrophoresis (DEP) has been attempted in the related art, there is a problem that the self-assembly rate is low due to the non-uniformity of the DEP force.

Meanwhile, according to an undisclosed internal technology, simultaneous assembly of a red (R) micro LED chip, a green (G) micro LED chip, and a blue (B) LED chip using dielectrophoresis is being studied.

However, in order for the R, G, and B LED chips to be accurately assembled in the respective assembly hole, research on the exclusiveness of the chip shape in which the horizontal cross-sectional shapes of the R, G, and B LED chips are different has been conducted.

For example, according to the unpublished internal technology, the horizontal cross section of the R LED chip is a circular cross section, and based on this R chip, the long axis is increased at regular intervals and the short axis is decreased to produce two elliptical-shaped B LEDs and G LEDs, respectively. Assembly hole patterns (one circle, two ellipticals) corresponding to these circular and elliptical LEDs were formed on the substrate.

In addition, spaced apart assembly electrodes were formed inside the assembly hole so that the LED could be assembled in the assembly hole, and each assembly electrode was arranged to overlap the LED chip. Then, an electric field was formed between the two opposite assembly electrodes to assemble the micro LED by dielectrophoretic force.

However, according to an internal study, even if the shapes of the R, G, and B LED chips are exclusivity, the applied DEP force is not similar or the difference is not large, so there is a screen problem in that other LED chips block the entrance to the assembly hall. For example, there is a screen effect problem in which the R LED chip or G LED chip blocks the entrance of the assembly hole in the assembly hole for the B LED chip, and accordingly, there is a problem of a decrease in DEP selectivity between the LED chips.

On the other hand, in order to improve DEP selectivity by increasing the deviation of the DEP force in each assembly hole between these R, G, and B LED chips, the horizontal cross-sectional shape of the R, G, and B LED chips is further increased to increase exclusivity. In this case, there is a technical contradiction in which the assembling probability of being seated in the assembly hole decreases due to the shape of the elliptical LED chip and the elliptical assembly hole.

SUMMARY OF THE DISCLOSURE

One of the technical objects of the embodiments is to provide an assembly substrate of a semiconductor light emitting device capable of increasing the assembling probability while increasing the DEP selectivity for the LED chips for each color in a self-assembly method using dielectrophoresis (DEP) and to provide a display device including the same.

The technical objects of the embodiments are not limited to those described in this item, and include those that can be inferred from the specification.

The assembly substrate structure of the semiconductor light emitting device according to the embodiment can include a first assembly substrate structure and a second assembly substrate structure spaced apart from each other on a substrate.

The first assembly substrate structure can include first and second electrodes spaced apart by a first distance, and a first partition wall having a circular first assembly hole.

The second assembly substrate structure can include third and fourth electrodes spaced apart by a second distance greater than the first distance, and a second partition wall having an elliptical second assembly hole.

The second assembly hole can include at least a second-first assembly hole and a second-second assembly hole overlapping each other.

The second-first assembly hole and the second-second assembly hole can have a first-second width in a long axis direction that is a central axis and a second-second width in a short axis direction perpendicular to the central axis.

The embodiment can further include a third assembly substrate structure disposed on one side of the second assembly substrate structure.

The third assembly substrate structure can include a third partition wall having a fifth electrode and a sixth electrode having a third distance in vertical distance greater than the second distance, and a third assembly hole having an elliptical shape.

The third assembly hole can include a third-first assembly hole and a third-second assembly hole at least partially overlapping each other.

The third-first assembly hole and the third-second assembly hole can have a first-third width in a long axis direction that is a central axis and a second-third width in a short axis direction perpendicular to the central axis.

The first-third width can be greater than the first-second width, and the second-third width can be smaller than the second-second width.

The third electrode can include a third protruding electrode protruding toward the fourth electrode.

The third electrode can include a third electrode body, a third-first protruding electrode protruding in the direction of the fourth electrode, and a third-second protruding electrode protruding in the direction of the fourth electrode and disposed adjacent to the third-first protruding electrode.

Surfaces of the third-first protruding electrode and the third-second protruding electrode can be flat.

The fourth electrode can include a fourth electrode body, and a fourth-first, a fourth-second protruding electrodes that protrude in the direction of the third electrode and are disposed adjacently.

Surfaces of the fourth-first protruding electrode and the fourth-second protruding electrode can be flat.

The flat surface of the third-first protruding electrode and the flat surface of the fourth-first protruding electrode can be parallel to each other.

In the second assembly substrate structure, surfaces of the third-first protruding electrode and the third-second protruding electrode can include a first curvature recess and a third curvature recess concave in a direction of the fourth electrode, respectively.

Surfaces of the fourth-first protruding electrode and the fourth-second protruding electrode can include a second curvature recess and a fourth curvature recess concave in a direction of the third electrode, respectively.

The second assembly substrate structure can further include a third-third protruding electrode disposed between the third-first protruding electrode and the third-second protruding electrode.

In addition, the display device according to the embodiment can include an assembly substrate structure of any one of the semiconductor light emitting devices.

According to the assembly substrate of the semiconductor light emitting device and the display device including the same according to the embodiment, in a self-assembly method using dielectrophoresis (DEP), there is a special technical effect in that assembling probability while increasing DEP selectivity for each color LED chips can be simultaneously increased.

For example, according to the embodiment, the DEP force of the second semiconductor light emitting device 150G corresponding to the second assembly hole 203b including the overlapping assembly hole is over twice than the DEP force exerted on the first semiconductor light emitting device 150R. Accordingly, there is a special technical effect that can significantly reduce the influence of the first semiconductor light emitting device 150R not corresponding to the assembly hole interfering with the assembly.

In addition, according to the embodiment, since the deviation of the DEP force applied to the elliptical second semiconductor light emitting device 150G is greater than the DEP force applied to the circular first semiconductor light emitting device 150R, the problem of the screen effect of the circular LED can be solved.

For example, in the embodiment, in the second assembly substrate structure N2, as shown in FIG. 15A, the second-first assembly hole 203b1 and the second-second assembly hole 203b2 are arranged in an overlapping form, and the distance between the assembly electrodes can be controlled. Accordingly, as the rotation angle increases, the overlapping portion between the second-first assembly hole 203b1 and the second-second assembly hole 203b2 decreases, thereby expanding the area to be assembled. Through this, the area of the assembly region substantially contributed by the second-first assembly hole 203b1 and the second-second assembly hole 203b2 is expanded, and the area of the second region R2 overlapping the assembly electrode is also expanded. Therefore, there is a complex technical effect in that the embodiment not only increases the assembly probability, but also increases the DEP force on the second semiconductor light emitting device 150G.

In addition, according to the embodiment, the second-first assembly hole 203b1 and the second-second assembly hole 203b2 are overlapped to increase the normal assembly probability, and the DEP force applied to the second semiconductor light emitting device 150G is increased such that there is a special technical effect not only increasing the probability of assembly, but also significantly improving the assembly speed.

In addition, according to the second-second assembly substrate structure N2b according to the embodiment, the first semiconductor light emitting device 150R having a circular shape is formed by having concave recesses on the surfaces of the third electrode 201b and the fourth electrode 202b such that an area overlapping the third electrode 201b and the fourth electrode 202b can be further reduced.

Through this, even if the circular first semiconductor light emitting device 150R is temporarily positioned on the second-second assembly substrate structure N2b according to the embodiment, the DEP force therefor can be remarkably weak, thereby significantly reducing the possibility of interfering with the assembly of the second semiconductor light emitting device 150G.

In addition, the second-third assembly substrate structure N2c according to the embodiment can include three assembly holes, at least a portion of which overlaps each other. Accordingly, there is a technical effect of further increasing the probability that the elliptical semiconductor light emitting device is assembled.

In addition, in the second-third assembly substrate structure N2c according to the embodiment, at least three or more protruding electrodes can be disposed on the third electrode 201b and the fourth electrode 202b to face each other.

Accordingly, the distance between the third electrode 201b and the fourth electrode 202b can be designed to be equal to or greater than the diameter of the circular first semiconductor light emitting device, so that a region in which the circular first semiconductor light emitting device 150R can overlap the third electrode 201b and the fourth electrode 202b can be further reduced.

Accordingly, even when the circular first semiconductor light emitting device 150R is temporarily positioned on the second-third assembly substrate structure N2c according to the embodiment, the DEP force due to this can be significantly weaker. Therefore, the possibility that the first semiconductor light emitting device 150R interferes with the assembly of the second semiconductor light emitting device 150G can be significantly reduced. In addition, there is a complex technical effect that can significantly increase the probability that an elliptical semiconductor light emitting device is assembled by including three assembly holes overlapping each other.

The technical effects of the embodiments are not limited to those described in this item, and include those that can be understood throughout the specification.

BRIEF DESCRIPTION OF THE DRAWINGS

The present invention will become more fully understood from the detailed description given hereinbelow and the accompanying drawings which are given by way of illustration only, and thus are not limitative of the present invention.

FIG. 1 is an exemplary view of a living room of a house in which a display device according to an embodiment is disposed.

FIG. 2 is a block diagram schematically showing a display device according to an embodiment.

FIG. 3 is a circuit diagram illustrating an example of the pixel of FIG. 2.

FIG. 4 is an enlarged view of a first panel area in the display device of FIG. 1.

FIG. 5 is a cross-sectional view taken along line B1-B2 of area A2 of FIG. 4.

FIG. 6 is an exemplary view in which the light emitting device according to the embodiment is assembled on a substrate by a self-assembly method.

FIG. 7 is a partially enlarged view of area A3 of FIG. 6.

FIGS. 8A and 8B are structural diagrams of an assembly substrate according to an embodiment.

FIG. 8C is an exemplary view of the assembly hole shown in FIG. 8A.

FIGS. 9A to 9C are schematic views showing the degree of rotation of the semiconductor light emitting device in the normal assembly level on the assembly hole.

FIGS. 10A and 10B are DEP force data according to the rotation angle of the semiconductor light emitting device in the assembly hole.

FIG. 11A is a plan view of a first semiconductor light emitting device positioned on a third assembly hole.

FIG. 11B is a cross-sectional view taken along line C1-C2 in FIG. 11A.

FIG. 12A is a plan view of a first semiconductor light emitting device inserted into a third assembly hole.

FIG. 12B is a cross-sectional view taken along line C1-C2 in FIG. 12A.

FIG. 13A is a new superimposed assembly substrate structure for assembling first to third semiconductor light emitting devices of the embodiment.

FIG. 13B is a state diagram in which first to third semiconductor light emitting devices are assembled in the structure of the superimposed assembly substrate according to the embodiment.

FIGS. 14A to 14D are manufacturing process diagrams of a second assembly substrate structure of the overlapping assembly substrate structure of the embodiment shown in FIG. 13A.

FIG. 15A is a schematic view in which a second semiconductor light emitting device is assembled on the second assembly substrate structure shown in FIG. 13A.

FIG. 15B is a comparative schematic diagram of a first semiconductor light emitting device positioned on the second assembly substrate structure shown in FIG. 13A.

FIG. 16 is DEP force data according to a rotation angle of a semiconductor light emitting device in an assembly hole of an overlapping assembly substrate structure according to an embodiment.

FIG. 17A is a schematic view in which a third semiconductor light emitting device is assembled on the third assembly substrate structure shown in FIG. 13A.

FIG. 17B is a comparative schematic diagram of a second semiconductor light emitting device positioned on the third assembly substrate structure shown in FIG. 13A.

FIGS. 18A and 18B are a second-second assembly substrate structure according to the embodiment.

FIGS. 19A and 19B are a second-third assembly substrate structure according to an embodiment.

DETAILED DESCRIPTION OF THE EMBODIMENTS

Hereinafter, embodiments disclosed in the present specification will be described in detail with reference to the accompanying drawings. The suffixes 'module' and 'part' for the components used in the following description are given or mixed in consideration of ease of writing the specification, and do not have distinct meanings or roles by themselves. In addition, the accompanying drawings are provided for easy understanding of the embodiments disclosed in the present specification, and the technical spirit disclosed in the present specification is not limited by the accompanying drawings. Also, when an element, such as a layer, region, or substrate, is referred to as being 'on' another component, this includes that it is directly on the other element or there can be other intermediate elements in therebetween.

The display device described in this specification can include a digital TV, a mobile phone, a smart phone, a laptop computer, a digital broadcasting terminal, a personal digital assistant (PDA), a portable multimedia player (PMP), a navigation system, a slate PCs, Tablet PCs, Ultra-Books, desktop computers, or the like. However, the configuration according to the embodiment described in the present specification can be applied to a display capable device even if it is a new product form to be developed later.

Hereinafter, a semiconductor light emitting device according to an embodiment and a display device including the same will be described.

FIG. 1 illustrates a living room of a house in which a display device 100 according to an embodiment is disposed.

The display apparatus 100 according to the embodiment can display the states of various electronic products such as the washing machine 101, the robot cleaner 102, and the air cleaner 103. In addition, it is possible to communicate with each electronic product based on IOT and to control each electronic product based on user's setting data.

The display apparatus 100 according to the embodiment can include a flexible display manufactured on a thin and flexible substrate. The flexible display can be bent or rolled like paper while maintaining the characteristics of the conventional flat panel display.

In the flexible display, visual information can be implemented by independently controlling light emission of unit pixels arranged in a matrix form. A unit pixel means a minimum unit for realizing one color. A unit pixel of the flexible display can be implemented by a light emitting device. In an embodiment, the light emitting device can be a Micro-LED or a Nano-LED, but is not limited thereto.

FIG. 2 is a block diagram schematically showing a display device according to an embodiment, and FIG. 3 is a circuit diagram showing an example of the pixel of FIG. 2.

Referring to FIGS. 2 and 3, the display device according to the embodiment can include a display panel 10, a driving circuit 20, a scan driver 30, and a power supply circuit 50.

The display apparatus 100 of the embodiment can drive the light emitting device in an active matrix (AM) method or a passive matrix (PM) method.

The driving circuit 20 can include a data driver 21 and a timing controller 22.

The display panel 10 can be divided into a display area DA and a non-display area NDA disposed around the display area DA. The display area DA is an area in which pixels PX are formed to display an image. The display panel 10 includes data lines (D1 to Dm, m is an integer greater than or equal to 2), scan lines intersecting the data lines D1 to Dm (S1 to Sn, n is an integer greater than or equal to 2), a high-potential voltage line supplied with high potential voltage, the low-potential voltage line supplied with the low-potential voltage, and the pixels PX connected to the data lines D1 to Dm and the scan lines S1 to Sn.

Each of the pixels PX can include a first sub-pixel PX1, a second sub-pixel PX2, and a third sub-pixel PX3. The first sub-pixel PX1 emits a first color light of a first wavelength, the second sub-pixel PX2 emits a second color light of a second wavelength, and the third sub-pixel PX3 emits a third color light of a third wavelength. The first color light can be red light, the second color light can be green light, and the third color light can be blue light, but it is not limited thereto. Also, although it is illustrated that each of the pixels PX includes three sub-pixels in FIG. 2, but it not limited thereto. For example, each of the pixels PX can include four or more sub-pixels.

Each of the first sub-pixel PX1, the second sub-pixel PX2, and the third sub-pixel PX3 can be connected to at least one of the data lines D1 to Dm, at least one of the scan lines S1 to Sn, and high voltage line. As shown in FIG. 3, the first sub-pixel PX1 can include a plurality of transistors and at least one capacitor Cst for supplying current to the light emitting devices LD.

In the drawings, each of the first sub-pixel PX1, the second sub-pixel PX2, and the third sub-pixel PX3 can include only one light emitting device LD and at least one capacitor Cst.

Each of the light emitting devices LD can be a semiconductor light emitting diode including a first electrode, a plurality of conductive semiconductor layers, and a second electrode. Here, the first electrode can be an anode electrode and the second electrode can be a cathode electrode, but it is not limited thereto.

Referring to FIG. 3, the plurality of transistors can include a driving transistor DT for supplying current to the light emitting devices LD and a scan transistor ST for supplying a data voltage to the gate electrode of the driving transistor DT. The driving transistor DT has a gate electrode connected to a source electrode of the scan transistor ST, a source electrode connected to a high potential voltage line to which a high potential voltage is applied, and a drain electrode connected to the first electrodes of the light emitting devices LD. The scan transistor ST has a gate electrode connected to the scan line Sk, where k is an integer satisfying 1≤k≤n, a source electrode connected to the gate electrode of the driving transistor DT, and a drain electrode connected to data lines Dj, where j is an integer satisfying 1≤j≤m.

The capacitor Cst can be formed between the gate electrode and the source electrode of the driving transistor DT. The storage capacitor Cst can charge a difference between the gate voltage and the source voltage of the driving transistor DT.

The driving transistor DT and the scan transistor ST can be formed of a thin film transistor. Also, in FIG. 3, the driving transistor DT and the scan transistor ST are mainly formed of a P-type MOSFET (Metal Oxide Semiconductor Field Effect Transistor), but it is not limited thereto. The driving transistor DT and the scan transistor ST can be formed of an N-type MOSFET. In this case, the positions of the source electrode and the drain electrode of each of the driving transistor DT and the scan transistor ST can be changed.

Each of the first sub-pixel PX1, the second sub-pixel PX2, and the third sub-pixel PX3 can include one driving transistor DT, one scan transistor ST, and one capacitor Cst with 2T1C (2 Transistor-1 capacitor) exemplified as in FIG. 3, but it is not limited thereto. Each of the first sub-pixel PX1, the second sub-pixel PX2, and the third sub-pixel PX3 can include a plurality of scan transistors ST and a plurality of capacitors Cst.

Referring back to FIG. 2, the driving circuit 20 outputs signals and voltages for driving the display panel 10 so that the driving circuit 20 can include a data driver 21 and a timing controller 22.

The data driver 21 receives digital video data DATA and a source control signal DCS from the timing controller 22. The data driver 21 converts the digital video data DATA into analog data voltages according to the source control signal DCS and supplies them to the data lines D1 to Dm of the display panel 10.

The timing controller 22 receives digital video data DATA and timing signals from the host system. The timing signals can include a vertical sync signal, a horizontal sync signal, a data enable signal, and a dot clock. The host system can be an application processor of a smartphone or tablet PC, a monitor, or a system-on-chip of a TV.

The scan driver 30 receives the scan control signal SCS from the timing controller 22. The scan driver 30 generates scan signals according to the scan control signal SCS and supplies them to the scan lines S1 to Sn of the display panel 10. The scan driver 30 can include a plurality of transistors and can be formed in the non-display area NDA of the display panel 10. Alternatively, the scan driver 30 can be formed of an integrated circuit, and in this case, can be mounted on a gate flexible film attached to the other side of the display panel 10.

The power supply circuit 50 can generate a high potential voltage VDD and a low potential voltage VSS for driving the light emitting devices LD of the display panel 10 from the main power source, and can supply high potential voltage line and low potential voltage line. Also, the power supply circuit 50 can generate and supply driving voltages for driving the driving circuit 20 and the scan driving unit 30 from the main power.

Next, FIG. 4 is an enlarged view of the first panel area A1 in the display device of FIG. 1.

Referring to FIG. 4, the display apparatus 100 according to the embodiment can be manufactured by mechanically and electrically connecting a plurality of panel areas such as the first panel area A1 by tiling.

The first panel area A1 can include a plurality of light emitting devices 150 arranged for each unit pixel (PX in FIG. 2).

For example, the unit pixel PX can include a first sub-pixel PX1, a second sub-pixel PX2, and a third sub-pixel PX3. For example, a plurality of red light-emitting devices 150R are disposed in the first sub-pixel PX1, a plurality of green light-emitting devices 150G are disposed in the second sub-pixel PX2, and a plurality of blue light-emitting devices 150B are disposed in the third sub-pixel PX3. The unit pixel PX can further include a fourth sub-pixel in which a light emitting device is not disposed, but it is not limited thereto. Meanwhile, the light emitting device 150 can be a semiconductor light emitting device.

Next, FIG. 5 is a cross-sectional view taken along line B1-B2 of area A2 of FIG. 4.

Referring to FIG. 5, the display device 100 according to the embodiment can include a substrate 200a, wirings 201a and 202a spaced apart from each other, a first insulating layer 211a, a second insulating layer 211b, and a third insulating layer 206 and a plurality of light emitting devices 150.

The wiring can include a first wiring 201a and a second wiring 202a spaced apart from each other. The first wiring 201a and the second wiring 202a can function as panel wiring for applying power to the light emitting device 150 in the panel, and it can also function as an assembled electrode to generate a dielectrophoretic force in the case of self-assembly of the light emitting device 150.

The wirings 201a and 202a can be formed of a transparent electrode (ITO) or can include a metal material having excellent electrical conductivity. For example, the wirings 201a and 202a can be formed of titanium (Ti), chromium (Cr), nickel (Ni), aluminum (Al), platinum (Pt), gold (Au), tungsten (W), or molybdenum (Mo) or at least one or an alloy thereof.

A first insulating layer 211a can be disposed between the first wiring 201a and the second wiring 202a, and a second insulating layer 211a can be disposed on the first wiring 201a and the second wiring 202a. 211b. The first insulating layer 211a and the second insulating layer 211b can be an oxide film, a nitride film, or the like, but are not limited thereto.

The light emitting device 150 can include, but is not limited to, a red-light emitting device 150R, a green light emitting device 150G, and a blue light emitting device 150B0 to form a sub-pixel, respectively, and a red phosphor and a green phosphor or the like can be provided to implement red and green, respectively.

The substrate 200 can be formed of glass or polyimide. Also, the substrate 200 can include a flexible material such as polyethylene naphthalate (PEN) or polyethylene terephthalate (PET). In addition, the substrate 200 can be made of a transparent material, but it is not limited thereto. The substrate 200 can function as a support substrate in the panel, and can function as a substrate for assembly when self-assembly of the light emitting device.

The third insulating layer 206 can include an insulating and flexible material such as polyimide, PEN, PET, etc., and can be integrally formed with the substrate 200 to form one substrate.

The third insulating layer 206 can be a conductive adhesive layer having adhesiveness and conductivity, and the conductive adhesive layer can be flexible to enable a flexible function of the display device. For example, the third insulating layer 206 can be an anisotropy conductive film (ACF) or a conductive adhesive layer such as an anisotropic conductive medium or a solution containing conductive particles. The conductive adhesive layer can be a layer that is electrically conductive in a direction perpendicular to the thickness but electrically insulating in a direction horizontal to the thickness.

The distance between the wirings 201a and 202a is formed to be smaller than the width of the light emitting device 150 and the width of the assembly hole 203, so that the assembly position of the light emitting device 150 using an electric field can be more precisely fixed.

A third insulating layer 206 is formed on the wirings 201a and 202a to protect the wirings 201a and 202a from the fluid 1200 and to prevent leakage of current flowing through the wirings 201a and 202a. The third insulating layer 206 can be formed of a single layer or multiple layers of an inorganic insulator such as silica or alumina or an organic insulator.

In addition, the third insulating layer 206 can include an insulating and flexible material such as polyimide, PEN, PET, etc., and can be integrally formed with the substrate 200 to form one substrate.

The third insulating layer 206 has a partition wall, and an assembly hole 203 can be formed by the partition wall. For example, the third insulating layer 206 can include an assembly hole 203 through which the light emitting device 150 is inserted (refer to FIG. 6). Accordingly, during self-assembly, the light emitting device 150 can be easily inserted into the assembly hole 203 of the third insulating layer 206. The assembly hole 203 can be referred to as an insertion hole, a fixing hole, an alignment hole, or the like.

The assembly hole 203 can have a shape and a size corresponding to the shape of the light emitting device 150 to be assembled at a corresponding position. Accordingly, it is possible to prevent other light emitting devices from being assembled in the assembly hole 203 or from assembling a plurality of light emitting devices.

Next, FIG. 6 is a view showing an example in which the light emitting device according to the embodiment is assembled on a substrate by a self-assembly method, and FIG. 7 is a partially enlarged view of area A3 of FIG. 6. FIG. 7 is a view of a state in which area A3 is rotated by 180 degrees for convenience of explanation.

An example in which the semiconductor light emitting device according to the embodiment is assembled in a display panel by a self-assembly method using an electromagnetic field will be described with reference to FIGS. 6 and 7.

The assembly substrate 200 to be described later can also function as a panel substrate in the display device after assembly of the light emitting device, but the embodiment is not limited thereto.

Referring to FIG. 6, the semiconductor light emitting device 150 can be put into a chamber 1300 filled with a fluid 1200, and the semiconductor light emitting device 150 is moved on the substrate 200 by the magnetic field generated from the assembly apparatus 1100. In this case, the light emitting device 150 adjacent to the assembly hole 203 of the assembly substrate 200 can be assembled in the assembly hole 230 by a dielectrophoretic force by an electric field of the assembly electrodes. The fluid 1200 can be water such as ultrapure water, but it is not limited thereto. A chamber can be referred to as a water bath, container, vessel, or the like.

After the semiconductor light emitting device 150 is put into the chamber 1300, the assembly substrate 200 can be disposed on the chamber 1300. According to an embodiment, the assembly substrate 200 can be introduced into the chamber 1300.

Referring to FIG. 7, the semiconductor light emitting device 150 can be implemented as a vertical semiconductor light emitting device as shown, but it is not limited thereto, and a horizontal light emitting device can be employed.

The semiconductor light emitting device 150 can include a magnetic layer having a magnetic material. The magnetic layer can include a magnetic metal such as nickel (Ni). Since the semiconductor light emitting device 150 injected into the fluid includes a magnetic layer, it can move to the substrate 200 by a magnetic field generated from the assembly apparatus 1100. The magnetic layer can be disposed above, below, or on both sides of the light emitting device.

The semiconductor light emitting device 150 can include a passivation layer 156 surrounding the top and side surfaces. The passivation layer 156 can be formed by using an inorganic insulator such as silica or alumina through PECVD, LPCVD, sputtering deposition, or the like. In addition, the passivation layer 156 can be formed through a method of spin coating an organic material such as a photoresist or a polymer material.

The semiconductor light emitting device 150 can include a layer structure 152 having a first conductivity type semiconductor layer 152a, a second conductivity type semiconductor layer 152c, and an active layer 152b disposed therebetween. The first conductivity-type semiconductor layer 152a can be an n-type semiconductor layer, and the second conductivity-type semiconductor layer 152c can be a p-type semiconductor layer, but it is not limited thereto.

A first electrode 154a can be connected to the first conductivity type semiconductor layer 152a, and a second electrode 154b can be connected to the second conductivity type semiconductor layer 152c. To this end, some regions of the first conductivity-type semiconductor layer 152a and the second conductivity-type semiconductor layer 152c can be exposed to the outside. Accordingly, after the semiconductor light emitting device 150 is assembled on the assembly substrate 200, a portion of the passivation layer 156 can be etched in the manufacturing process of the display device.

The assembly substrate 200 can include a pair of first assembly electrodes 201 and second assembly electrodes 202 corresponding to each of the semiconductor light emitting devices 150 to be assembled. The first assembly electrode 201 and the second assembly electrode 202 can be formed by stacking a single metal, a metal alloy, or a metal oxide in multiple layers. For example, the first assembled electrode 201 and the second assembled electrode 202 can be formed by at least one of Cu, Ag, Ni, Cr, Ti, Al, Rh, Pd, Ir, Ru, Mg, Zn, Pt, Au, Hf, but it is not limited thereto. In addition, the first assembly electrode 201 and the second assembly electrode 202 can be formed by at least one of indium tin oxide (ITO), indium zinc oxide (IZO), indium zinc tin oxide (IZTO), indium aluminum zinc oxide (IAZO), and IGZO (indium gallium zinc oxide), IGTO (indium gallium tin oxide), AZO (aluminum zinc oxide), ATO (antimony tin oxide), GZO (gallium zinc oxide), IZON (IZO Nitride), AGZO (Al—Ga ZnO), IGZO (In—Ga ZnO), ZnO, IrOx, RuOx, NiO, RuOx/ITO, Ni/IrOx/Au, or Ni/IrOx/Au/ITO, but it is not limited thereto.

The first assembly electrode 201 and the second assembly electrode 202 emit an electric field as an AC voltage is applied, thereby fixing the semiconductor light emitting device 150 injected into the assembly hole 203 by dielectrophoretic force. The distance between the first assembly electrode 201 and the second assembly electrode 202 can be smaller than the width of the semiconductor light emitting device 150 and the width of the assembly hole 203, and the assembly position can be fixed more precisely.

An insulating layer 212 can be formed on the first assembly electrode 201 and the second assembly electrode 202 to protect the first assembly electrode 201 and the second assembly electrode 202 from the fluid 1200, and it is possible to prevent leakage of current flowing through the first assembled electrode 201 and the second assembled electrode 202.

For example, the insulating layer 212 can be formed of a single layer or multiple layers of an inorganic insulator such as silica or alumina or an organic insulator. The insulating layer 212 can have a minimum thickness for preventing damage to the first assembly electrode 201 and the second assembly electrode 202 when assembling the semiconductor light emitting device 150, and the semiconductor light emitting device 150 and the insulating layer 212 can have a maximum thickness for stably assembly.

A partition wall 207 can be formed on the insulating layer 212. A portion of the partition wall 207 can be located on the first assembly electrode 201 and the second assembly electrode 202, and the remaining area can be located on the assembly substrate 200.

Meanwhile, when the assembly substrate 200 is manufactured, a portion of the partition walls formed on the upper portion of the insulating layer 212 is removed, so that each of the semiconductor light emitting devices 150 is coupled and assembled to the assembly substrate 200 assembly hole 203.

An assembly hole 203 to which the semiconductor light emitting devices 150 are coupled is formed in the assembly substrate 200, and a surface on which the assembly hole 203 is formed can be in contact with the fluid 1200. The assembly hole 203 can guide an accurate assembly position of the semiconductor light emitting device 150.

Meanwhile, the assembly hole 203 can have a shape and a size corresponding to the shape of the semiconductor light emitting device 150 to be assembled at a corresponding position. Accordingly, it is possible to prevent assembling other semiconductor light emitting devices or assembling a plurality of semiconductor light emitting devices in the assembly hole 203.

Referring back to FIG. 6, after the assembly substrate 200 is disposed in the chamber, the assembly apparatus 1100 applying a magnetic field can move along the assembly substrate 200. The assembly device 1100 can be a permanent magnet or an electromagnet.

The assembling apparatus 1100 can move while in contact with the assembling substrate 200 in order to maximize the area applied by the magnetic field into the fluid 1200. According to an embodiment, the assembling apparatus 1100 can include a plurality of magnetic materials or a magnetic material having a size corresponding to that of the assembly substrate 200. In this case, the moving distance of the assembly apparatus 1100 can be limited within a predetermined range.

The semiconductor light emitting device 150 in the chamber 1300 can move toward the assembly apparatus 1100 and the assembly substrate 200 by the magnetic field generated by the assembly apparatus 1100.

Referring to FIG. 7, the semiconductor light emitting device 150 moves toward the assembly apparatus 1100, and can enter and be fixed in the assembly hole 203 by the dielectrophoretic (DEP) force formed by the electric field of the assembly electrode of the assembly substrate.

Specifically, the assembly electrodes 201 and 202 can form an electric field by AC power, and a dielectrophoretic force can be formed between the assembly electrodes 201 and 202 by this electric field. The semiconductor light emitting device 150 can be fixed to the assembly hole 203 on the substrate 200 by this dielectrophoretic force.

In this case, a predetermined solder layer is formed between the light emitting device 150 assembled on the assembly hole 203 of the substrate 200 and the assembly electrode, thereby improving the bonding force of the light emitting device 150.

Also, a molding layer can be formed in the assembly hole 203 of the assembly substrate 200 after assembly. The molding layer can be a transparent resin or a resin including a reflective material and a scattering material.

By the self-assembly method using the above-described electromagnetic field, the time required for each of the semiconductor light emitting devices to be assembled on the substrate can be rapidly reduced, so that a large-area high-pixel display can be implemented more quickly and economically.

Next, FIG. 8A is an assembly substrate structure according to the embodiment, and FIG. 8B is an exemplary diagram of a semiconductor light emitting device disposed on the assembly substrate structure according to FIG. 8A. Also, FIG. 8C is an exemplary view of the assembly hole shown in FIG. 8A.

In an embodiment, the assembly hole of the substrate can have a shape and a size corresponding to the shape of a semiconductor light emitting device to be assembled at a corresponding position. Accordingly, it is possible to prevent assembling other semiconductor light emitting devices or assembling a plurality of semiconductor light emitting devices in the assembly hole.

Also, according to an undisclosed internal technology, simultaneous assembly of R micro-LED chip, G micro-LED chip, and B LED chip using dielectrophoresis is being studied.

However, in order for the R, G, and B LED chips to be accurately assembled in the respective assembly hole, research on the exclusiveness of the chip shape in which the horizontal cross-sectional shapes of the R, G, and B LED chips are different is being conducted.

For example, referring to FIG. 8A, the assembly substrate structure 200A1 according to the embodiment can include a plurality of first assembly electrodes 201 and second assembly electrodes 202 spaced apart from each other.

In addition, the embodiment can include a partition wall 207 disposed on each of the assembly electrodes 201 and 202.

The partition wall 207 can include a first assembly hole 203a, a second assembly hole 203b, and a third assembly hole 203c, which are partially removed in consideration of the shape of the light emitting device to be assembled. The insulating layer 212 can be exposed by the first assembly hole 203a, the second assembly hole 203b, and the third assembly hole 203c.

A horizontal cross section of the first assembly hole 203a can be circular, and a horizontal cross section of the second assembly hole 203b and the third assembly hole 203c can be elliptical.

Referring to FIG. 8B, the first semiconductor light emitting device 150R, the second semiconductor light emitting device 150G, and the third semiconductor light emitting device 150B can be assembled in the first assembly hole 203a, the second assembly hole 203b and the third assembly holes 203c respectively. The first semiconductor light emitting device 150R can be an R LED chip, the second semiconductor light emitting device 150G can be a G LED chip, and the third semiconductor light emitting device 150B can be a B LED chip.

A horizontal cross section of the first assembling hole 203a can be circular, and horizontal cross sections of the second assembling hole 203b and the third assembling hole 203c can be elliptical.

Specifically, referring to FIG. 8C, the first assembly hole 203a can have a first width a1 in the first direction with respect to the first axis 1st and a first width b1 in the second direction in a second axis 2nd perpendicular to the first axis, and the first width a1 in the first direction and the first width b1 in the second direction can be the same, but are not limited thereto.

Next, the second assembly hole 203b can have a second width a2 in the first direction and a second width b2 in the second direction, and the third assembly hole 203c can have a third width a3 in the first direction and a third width b3 in the second direction.

For example, the first assembly hole 203a can include a circular cross-section in which the first width a1 in the first direction and the first width b1 in the second direction are 38 µm, respectively.

In this case, the second assembling hole 203b and the third assembling hole 203c can have a predetermined exclusion interval based on the first assembling hole 203a. For example, the long axis (for example, the width in the first direction) 203a in the second assembling hole 203b and the third assembling hole 203c can increase at an exclusive interval based on the first assembling hole, and the short axis (for example, the width in the second direction) can be reduced. The exclusion interval can be about 5 µm to 10 µm, but is not limited thereto.

For example, if the first assembly hole 203a has a circular cross-section in which the first width a1 in the first direction and the first width b1 in the second direction are 38 µm, respectively, and the exclusion interval is 7 µm, a second width a2 of the second assembly hole 203b in the first direction can be 45 µm, and a second width b2 of the second assembly hole 203b in the second direction can be 31 µm.

In addition, the third width a3 in the first direction of the third assembly hole 203c can be 52 µm, and the third width b3 in the second direction can be 24 µm, but is not limited thereto.

On the other hand, so that the LED can be assembled inside the assembly hole, assembling electrodes spaced apart are formed inside the assembly hole, and each assembly electrode is placed so that it can be overlapped with the LED chip, so that Micro LED can be assembled by dielectrophoretic force due to the electric field between the two facing assembly electrodes.

However, according to an internal study, the applied DEP force is similar or is not different even if the shape of the R, G, and B LED chips is exclusive. As a result, another R LED chip or G LED chip blocks an entrance to the assembly hole in the assembly hole for the B LED chip, creating a screen effect. Therefore, there is a problem of a decrease in DEP selectivity that prevents the LED chip from being properly assembled.

On the other hand, the DEP force applied to the LED is greatest when it is closest to the assembled electrode, and is proportional to the area overlapped with the assembled electrode.

Specifically, FIGS. 9A to 9C are schematic diagrams showing the degree of rotation of the semiconductor light emitting device on the assembly hole based on the standard assembly.

FIGS. 10A and 10B are DEP force data according to the rotation angle of the semiconductor light emitting device in the assembly hole.

First of all, FIG. 9A is a schematic diagram of a case in which the third semiconductor light emitting device 150B and the first semiconductor light emitting device 150R are respectively positioned on the elliptical third assembly hole 203c, and the third semiconductor light emitting device (150B) is in a state where it is normally assembled with reference to the third assembly hole 203c.

For example, (1) of FIG. 9A shows a case in which the first axis 1st of the third assembly hole 203c and the long axis Ct of the third semiconductor light emitting device 150B coincide.

Meanwhile, (2) of FIG. 9A shows a case in which the first semiconductor light emitting device 150R having a circular cross-section is positioned on the third assembling hole 203c having an elliptical shape.

Next, FIG. 9B is a schematic diagram of the case that the third semiconductor light emitting device 150B and the first semiconductor light emitting device 150R are positioned on the elliptical third assembly hole 203c while being rotated at a predetermined angle.

For example, the third semiconductor light emitting device 150B is positioned in a state rotated by about 30° with respect to the third assembly hole 203c. For example, the rotation occurs between the first axis 1st of the third assembly hole 203c and the long axis Ct of the third semiconductor light emitting device 150B by the first angle θ1 (refer to (1) in FIG. 9B).

Meanwhile, since the first semiconductor light emitting device 150R having a circular cross section is circular, it is in substantially the same state as that of (2) of FIG. 9A even when rotated (refer to (2) of FIG. 9B).

Next, FIG. 9C is a case that the elliptical third semiconductor light emitting device 150B is positioned in a state rotated by about 45° with respect to the third assembly hole 203c. For example, the rotation occurs between the first axis 1st of the third assembly hole 203c and the long axis Ct of the third semiconductor light emitting device 150B by the second angle θ2 (refer to (1) of FIG. 9C).

Also, even when the first semiconductor light emitting device 150R having a circular cross section is rotated, it is in substantially the same state as that of (2) of FIG. 9A (refer to (2) of FIG. 9C).

On the other hand, the DEP force applied to the LED increases as it approaches the assembled electrode, and in particular is proportional to the amount of overlapping area between the assembled electrode and the LED.

At this time, FIG. 10A is DEP force data according to the rotation angle of the third semiconductor light emitting device 150B and the first semiconductor light emitting device 150R in the third assembly hole 203c.

FIG. 10B is DEP force data according to the rotation angle of the third semiconductor light emitting device 150B and the first semiconductor light emitting device 150R in the second assembly hole 203b.

Referring to FIGS. 10A and 10B, when the elliptical third semiconductor light emitting device 150B and the second semiconductor light emitting device 150G are rotated with respect to the center, the DEP force of the LED gradually decreases since the overlapping area with the assembled electrode is reduced. On the other hand, since the circular first semiconductor light emitting device 150R has a circular cross section even when it is rotated, there is no change in the overlapping area with the assembled electrode, so that the DEP fore does not decrease.

In the assembly structure by the internal technology, the gap between the first assembly electrode 201 and the second assembly electrode 202 of the R, G, and B LEDs is in the same state. Since the gap between the assembled electrodes is the same, there is a problem that blocks the assembly of the elliptical LED chip by screening because the DEP force on the circular LED chip is rather large except for the position where the elliptical LED chip is assembled without rotation.

Specifically, referring to FIG. 10A, the DEP force on the third semiconductor light emitting device 150B having an elliptical shape positioned on the third assembly hole 203c is greater than that of the first semiconductor light emitting device 150R having a circular shape positioned on the third assembly hole 203c while the rotation angle θ is up to about 15°. However, when the rotation angle is about 30° or more, the DEP force on the circular first semiconductor light emitting device 150R becomes greater.

Also, referring to FIG. 10B, the DEP force applied to the second semiconductor light emitting device 150G having an elliptical shape positioned on the second assembly hole 203b is greater than that of the semiconductor light emitting device 150R with a circular shape positioned on the second assembly hole 203b, while the rotation angle θ is up to about 15°. Also, from the rotation angle of about 30° or more, the DEP force on the circular first semiconductor light emitting device 150R becomes greater.

Specifically, FIG. 11A is a plan view in which the circular first semiconductor light emitting device 150R is positioned on the third assembly hole 203c, and FIG. 11B is a cross-sectional view taken along line C1-C2 in FIG. 11A.

Also, FIG. 12A is a plan view in which the first semiconductor light emitting device 150R is inserted into the third assembly hole 203c, and FIG. 12B is a cross-sectional view taken along line C1-C2 in FIG. 12A.

As in FIGS. 10a and 10b above, even if there is an exclusiveness of the shape of the R, G, and B LED chips, the applied DEP force is similar or does not differ greatly. Alternatively, when rotation of the elliptical second semiconductor light emitting device 150G or the third semiconductor light emitting device 150B occurs, the DEP force applied thereto can be less than that applied to the circular first semiconductor light emitting device 150R. Accordingly, as shown in FIGS. 11A and 11B, therefore, there is a problem of a screen or block effect that the first semiconductor light emitting device 150R can block the entrance to the assembly hole in the third assembly hole 203c or the first semiconductor light emitting device 150R can be partially in the third assembly hole 203c. Therefore, there is a problem of a decrease in DEP selectivity that prevents the elliptical second and third semiconductor light emitting devices from being assembled.

However, in order to increase the deviation of the DEP force in the corresponding assembly hole of these R, G, and B LED chips, in the case of increasing the exclusivity by further adding a difference in the horizontal cross-sectional shape of the R, G, and B LED chips, due to the shape of the elliptical LED chip, there is a technical contradiction in which the assembling probability of being seated in the elliptical assembly hole is reduced.

One of the technical objects of the embodiment is to provide an assembly substrate and a display device including the same capable of increasing the assembling probability while increasing the DEP selectivity for the LED chips for each color in a self-assembly method using dielectrophoresis (DEP).

Hereinafter, specific features of the embodiments for solving the technical problems of the present invention will be described in detail with reference to the drawings.

FIG. 13A is a new superimposed assembly substrate structure 200N for assembling the first to third semiconductor light emitting devices 150R, 150G, and 150B of the embodiment, and FIG. 13B is the overlapping assembly substrate structure of the embodiment (200N) is a state diagram in which the first to third semiconductor light emitting devices 150R, 150G, and 150B are assembled.

The overlapping assembly substrate structure 200N of the embodiment can include a plurality of assembly substrate structures, and at least one assembly substrate structure can include an overlapping assembly hole.

Referring to FIG. 13A, the overlapping assembly substrate structure 200N of the embodiment can include a first assembly substrate structure N1, a second assembly substrate structure N2, and a third assembly substrate structure N3.

The first assembly substrate structure N1 can include a first electrode 201a and a second electrode 202a. A vertical distance between the first electrode 201a and the second electrode 202a can be a first distance D1.

The first assembly substrate structure N1 can include a first partition wall 207a having a circular first assembly hole 203a. For example, the first assembly hole 203a can have a first width a1 in the first direction and a first width b1 in the second direction.

Next, the second assembly substrate structure N2 can include a third electrode 201b and a fourth electrode 202b. A vertical distance between the third electrode 201b and the fourth electrode 202b can be a second distance D2. The second distance D2 can be greater than the first distance D1.

The second assembly substrate structure N2 can include a second partition wall 207b having an elliptical second assembly hole 203b.

In this case, the elliptical second assembly hole 203b can include an overlapping assembly hole. For example, the second assembly hole 203b can include a second-first assembly hole 203b1 and a second-second assembly hole 203b2. The second-first assembly hole 203b1 can at least partially overlap the second-second assembly hole 203b2. Each of the second-first assembling hole 203b1 and the second-second assembling hole 203b2 has a first-second width a2 in the long axis Ct1 direction and a second-second width b2 in the short axis direction Ct2 (refer to FIG. 14C).

Continuing to refer to FIG. 13A, the third assembly substrate structure N3 can include a fifth electrode 201c and a sixth electrode 202c. A vertical distance between the fifth electrode 201c and the sixth electrode 202c can be a third distance D3. The third distance D3 can be greater than the second distance D2.

The third assembly substrate structure N3 can include a third partition wall 207c having an elliptical third assembly hole 203c. The elliptical third assembly hole 203c can include an overlapping assembly hole.

For example, the third assembly hole 203c can include a third-first assembly hole 203c1 and a third-second assembly hole 203c2. The third-first assembly hole 203c1 can at least partially overlap the third-second assembly hole 203c2. Each of the third-first assembling hole 203c1 and third-second assembling hole 203c2 has a first-third width in a long axis direction and a second-third width in a short axis direction.

In this case, the first width a1 in the first direction and the first width b1 in the second direction of the first assembly hole 203a can each have a circular cross section of 38 μm. In addition, when the exclusion interval is about 7 μm, the second width a2 in the first direction in the second assembly hole 203b can be about 45 μm, and the second width in the second direction can have a width b2 of about 31 μm, the third width of the third assembly hole 203c in the first direction can be about 52 μm, and the third width b3 in the second direction can be about 24 μm, but is not limited thereto.

Next, FIGS. 14A to 14D are manufacturing process diagrams for the second assembly substrate structure N2 in the overlapping assembly substrate structure 200N of the embodiment shown in FIG. 13A.

Referring to FIG. 14A, the second assembly substrate structure N2 can include a third electrode 201b and a fourth electrode 202b on a predetermined substrate, and the third electrode 201b can include a third electrode body 201b0 and a third-first protruding electrode 201b1 and a third-second protruding electrode 201b2 protruding toward the fourth electrode 202b. Surfaces of the third-first protruding electrode 201b1 and the third-second protruding electrode 201b2 can be flat, but are not limited thereto.

In addition, the fourth electrode 202b can include a fourth electrode body 202b0, a fourth-first protruding electrode 202b1 and a fourth-second protruding electrode 202b2 protruding in the direction of the third electrode 201b. Surfaces of the fourth-first protruding electrode 202b1 and the fourth-second protruding electrode 202b2 can be flat, but are not limited thereto.

The surface of the third-first protruding electrode 201b1 and the surface of the fourth-first protruding electrode 202b1 can face each other, and the flat surfaces can be parallel to each other.

The surface of the third-second protruding electrode 201b2 and the surface of the fourth-second protruding electrode 202b2 can face each other, and the flat surfaces can be parallel to each other.

The second distance D2 between the third electrode 201b and the fourth electrode 202b can be the distance between the surfaces of the third-first protruding electrode 201b1 and the fourth-first protruding electrode 202b1.

In addition, the second distance D2 between the third electrode 201b and the fourth electrode 202b can be the distance between the surfaces of the third-second protruding electrode 201b2 and the fourth-second protruding electrode 202b2, but is not limited thereto.

Thereafter, as shown in FIG. 14B, after forming an insulating layer on the third electrode 201b and the fourth electrode 202b, a predetermined partition wall 207b material can be formed.

Next, a part of the partition wall 207 is removed to form a second assembly hole 203b including an elliptical second-first assembly hole 203b1 as shown in FIG. 14c, and a second-second assembly hole 203b2 as shown in FIG. 14d. The second-first assembly hole 203b1 and the second-second assembly hole 203b2 can be sequentially formed or can be formed simultaneously.

Referring back to FIG. 14C, the long axis Ct1 of the second-first assembly hole 203b1 can be inclined at a predetermined first angle θ1 based on the direction of the first axis 1st of the predetermined substrate.

The first angle Θ1 can be about 1° to 60°, but is not limited thereto.

For example, the first angle Θ1 can be about 5° to 60°, but is not limited thereto. Also, the first angle Θ1 can be about 10° to 50°, but is not limited thereto. Also, the first angle Θ1 can be about 15° to 45°, but is not limited thereto.

In the embodiment, even when the second semiconductor light emitting device 150G disposed in the second assembly hole 203b is rotated at the first angle, the active layer is located at the center between the assembly electrodes, so there is no problem in lighting.

In addition, the second-first assembly hole 203b1 can have a second-first width a2 based on the long axis Ct1 and a second-second width b2 based on a short axis Ct2 perpendicular to the long axis Ct1.

For example, in FIG. 13a, the first width a1 in the first direction and the first width b1 in the second direction of the first assembly hole 203a can each have a circular cross-section of 38 μm.

At this time, in FIG. 14c, the second-first width a2 based on the long axis Ct1 of the second-first assembly hole (203b1) is about 45 μm, the second-second width b2 based on the short axis Ct2 can be about 31 μm, but is not limited thereto.

Also, referring to FIG. 14D, the width based on the long axis and the width based on the short axis of the second-second assembly hole 203b2 can be same with the second-first width a2 and the second-second width b2 of the second-first assembly hole 203b1, respectively, but is not limited thereto.

Next, FIG. 15A is a schematic diagram in which the second semiconductor light emitting device 150G is assembled on the second assembly substrate structure N2 shown in FIG. 13A.

Referring to FIG. 15A, the second semiconductor light emitting device 150G can be assembled in the second assembly hole 203b of the second assembly substrate structure N2. A region where the second semiconductor light emitting device 150G overlaps the third electrode 201b and the fourth electrode 202b can have an area of the second region R2.

Meanwhile, FIG. 15B is a comparative schematic diagram N2R in which the circular first semiconductor light emitting device 150R is positioned on the second assembly substrate structure N2 shown in FIG. 13A.

Specifically, FIG. 15B is a schematic diagram in which the circular first semiconductor light emitting device 150R is temporarily positioned on the second assembly hole 203b of the second assembly substrate structure N2.

In this case, a region in which the circular first semiconductor light emitting device 150R overlaps the third electrode 201b and the fourth electrode 202b can have an area of the first region R1.

The area of the second region R2 in which the third electrode 201b and the fourth electrode 202b overlap in the elliptical second semiconductor light emitting device 150G in FIG. 15A is significantly larger than the area of the first region R1 in which the circular first semiconductor light emitting device 150R overlaps the third electrode 201b and the fourth electrode 202b.

Accordingly, the DEP force applied to the second semiconductor light emitting device 150G is significantly greater than that of the first semiconductor light emitting device 150R.

Specifically, FIG. 16 is DEP force data according to the rotation angle of the semiconductor light emitting device in the assembly hole of the overlapping type assembly substrate structure according to the embodiment.

FIG. 16 shows DEP force data according to a rotation angle G of each semiconductor light emitting device respectively in a case where the elliptical second semiconductor light emitting device 150G is positioned in the second assembly hole 203b of the second assembly substrate structure N2 of the embodiment (refer to FIG. 15A) and in a case where the circular light emitting device 150R is positioned in the second assembly holes 203b of the second assembly substrate structure N2 (refer to FIG. 15B).

In addition, DEP force data on the surface of the assembly hole according to the rotation angle Θ of the semiconductor light emitting device shown in FIG. 16 can be similarly applied a case in which the third semiconductor light emitting device 150B having an elliptical shape is positioned in the third assembly hole 203c of the third assembly substrate structure N3 according to the embodiment and in a case in which the circular first semiconductor light emitting device 150R is positioned in the third assembly hole 203c of the third assembly substrate structure N3.

As shown in FIGS. 15A and 14C, the long axis Ct1 of each second assembly hole 203b including the second-first assembly hole 203b1 or the second-second assembly hole 203b2 in the second assembly substrate structure N2 according to the embodiment can be inclined at a predetermined angle based on the direction of the first axis 1st.

Referring to the DEP force data of FIG. 16, the long axis Ct1 of the second assembly hole 203b in the second assembly substrate structure N2 according to the embodiment can have a rotation angle based on the direction of the first axis 1st, and as the rotation angle increases to a certain range, there is a special technical effect that the DEP force on the second semiconductor light emitting device 150G increases.

For example, as the rotation angle Θ increases by about 1° to 30°, there is a special technical effect that the DEP force on the second semiconductor light emitting device 150G increases.

In addition, the rotation angle Θ is in the range of about 1° to 45°, the DEP force applied to the second semiconductor light emitting device 150G is more than twice as large as the DEP force applied to the circular first semiconductor light emitting device 150R. For example, when the rotation angle Θ is in the range of about 1° to 45°, there is a special technical effect that the DEP force applied to the second semiconductor light emitting device 150G is 2.5 to 4 times greater than that of the circular first semiconductor light emitting device 150R.

According to the embodiment, the DEP force of the second semiconductor light emitting device 150G corresponding to the second assembly hole 203b is significantly greater than twice the DEP force of the first semiconductor light emitting device 150R. For this reason, there is a special technical effect that can significantly reduce the influence of the first semiconductor light emitting device 150R not corresponding to the assembly hole interfering with the assembly.

In addition, according to the embodiment, the deviation of the DEP force applied to the elliptical second semiconductor light emitting device 150G is larger than the DEP force applied to the circular first semiconductor light emitting device 150R, so the screen problem of the circular LED can be solved.

Specifically, in the embodiment, the second assembling substrate structure N2 can include a second-first assembling hole 203b1 and a second-second assembling hole 203b2 in an overlapping form as shown in FIG. 15A, and the rotation portion overlapping each other between the second-first assembly hole 203b1 and the second-second assembly hole 203b2 is reduced as the rotation angle increases, and thus the area to be assembled can be expanded.

Accordingly, according to the embodiment, there are special technical effects that can increase DEP force applied to the second semiconductor light emitting device 150G and can include precise probability of assembly by arranging the second-first assembly hole 203b1 and the second-second assembly hole 203b2.

In addition, in the embodiment, since the assembly region substantially contributed by the second-first assembly hole 203b1 and the second-second assembly hole 203b2 can be expanded and at the same time, the second region R2 overlapping the assembly electrodes can be extended, there is a complex technical effect of increasing the assembly probability as well as increasing the DEP force on the second semiconductor light emitting device 150G.

In addition, according to the embodiment, by overlapping the second-first assembly hole 203b1 and the second-second assembly hole 203b2, the precise probability assembly can be increased, and the DEP force applied to the second semiconductor light emitting device 150G can be increased, so there is a special technical effect that not only can increase the probability of precise assembly, but also significantly can improve the speed of precise assembly.

Accordingly, the embodiment has a technical effect of simultaneously increasing the assembling probability while increasing the DEP selectivity for the LED chips for each color in the self-assembly method using dielectrophoresis (DEP).

Next, FIG. 17A is a schematic diagram in which the third semiconductor light emitting device 150B is assembled on the third assembly substrate structure N3 shown in FIG. 13A.

Referring to FIG. 17A, a third semiconductor light emitting device 150B can be assembled in the third assembly hole 203c of the third assembly substrate structure N3. The third semiconductor light emitting device 150B can have a third region R3 where the third semiconductor light emitting device 150B overlaps the fifth electrode 201c and the sixth electrode 202c.

Meanwhile, FIG. 17B is a comparative schematic diagram N3R in which the second semiconductor light emitting device 150G is positioned on the third assembly substrate structure N3 shown in FIG. 13A. For example, FIG. 17B is a schematic diagram of the second semiconductor light emitting device 150G passing through the third assembling hole 203c of the third assembling substrate structure N3 and temporarily positioned thereon. In this case, a region overlapping the fifth electrode 201c and the sixth electrode 202c of the second semiconductor light emitting device 150G can have an area of a third-second region R3a.

The area of the third region R3 in which the elliptical third semiconductor light emitting device 150B overlaps the fifth electrode 201c and the sixth electrode 202c in FIG. 17A is significantly greater than the area of the third-second region R3a in which the elliptical second semiconductor light emitting device 150G overlaps the fifth electrode 201c and the sixth electrode 202c. Accordingly, the DEP force applied to the third semiconductor light emitting device 150B by the fifth electrode 201c and the sixth electrode 202c is significantly greater than that of the second semiconductor light emitting device 150G. Of course, the DEP force applied to the third semiconductor light emitting device 150B by the fifth electrode 201c and the sixth electrode 202c is significantly greater than that of the circular first semiconductor light emitting device 150R.

Accordingly, the DEP force of the third semiconductor light emitting device 150B corresponding to the third assembling hole 203c including the overlapping assembly hole is significantly greater than the DEP force applied to the second semiconductor light emitting device 150G or the first semiconductor light emitting device 150R. For this reason, there is a special technical effect that can significantly reduce the influence of the second semiconductor light emitting device 150G or the first semiconductor light emitting device 150R not corresponding to the third assembling hole 203c interfering with the assembly.

Next, FIGS. 18A and 18B are a second-second assembly substrate structure N2b according to the embodiment.

The second-second assembly substrate structure N2b according to the embodiment can include a third electrode 201b and a fourth electrode 202b on a predetermined substrate, and the third electrode 201b can include an electrode body 201b0 and a third-first protruding electrode 201b1 and a third-second protruding electrode 201b2 protruding toward the fourth electrode 202b.

Surfaces of the third-first protruding electrode 201b1 and the third-second protruding electrode 201b2 can have a first curvature recess r1 and a third curvature recess r3 concave in the direction of the fourth electrode 202b.

The surfaces of the fourth-first protruding electrode 202b1 and the fourth-second protruding electrode 202b2 have a second curvature recess r2 and a fourth curvature recess r4 concave toward the third electrode 201b.

The distance between the third electrode 201b and the fourth electrode 202b can have a second-second distance D2a, and can be longer than the second distance D2 which is a distance between the third electrode 201b and the fourth electrode 202b having flat surfaces (refer to FIG. 15A).

After forming and patterning the partition wall 207 as shown in FIG. 18B, the second assembly hole 203b including the second-first assembly hole 203b1 and the second-second assembly hole 203b2 partially overlapping each other can be formed.

According to the second-second assembly substrate structure N2b according to the embodiment, the area in which the first semiconductor light emitting device 150R having a circular shape overlaps the third electrode 201b and the fourth electrode 202b can be further reduced by having concave recesses on the surfaces of the third electrode 201b and the fourth electrode 202b.

Through this, even if the circular first semiconductor light emitting device 150R is temporarily positioned on the second-second assembly substrate structure N2b according to the embodiment, the DEP force is remarkably weak, so there is a special technical effect that can significantly reduce the possibility that the first semiconductor light emitting device 150R interferes with the assembly of the second semiconductor light emitting device 150G.

Next, FIGS. 19a and 19b are a second-third assembly substrate structure (N2c) according to the embodiment.

Referring to FIG. 19A, the second-third assembly substrate structure N2c according to the embodiment can include a third electrode 201b and a fourth electrode 202b on a predetermined substrate, and the third electrode 201b can include a third electrode body 201b0, a third-first protruding electrode 201b1, a third-second protruding electrode 201b2, and a third-third protruding electrode 201b3 protruding in the direction of the fourth electrode 202b.

The surfaces of the third-first protruding electrode 201b1, the third-second protruding electrode 201b2, and the third-third protruding electrode 201b3 can be flat in the direction of the fourth electrode 202b, but it is not limited and can be provided with a concave recess.

In addition, in the second-third assembly substrate structure N2c, the fourth electrode 202b can include a fourth electrode body 202b0, a fourth-first protruding electrode 202b1 protruding in the direction of the third electrode 201b, a fourth-second protruding electrode 202b2, and a fourth-third protruding electrode 202b3.

The surfaces of the fourth-first protruding electrode 202b1, the fourth-second protruding electrode 202b2, and the fourth-third protruding electrode 202b3 can be flat in the direction of the third electrode 201b, but it is not limited and can be provided with a concave recess.

The distance between the third electrode 201b and the fourth electrode 202b can be a second-third distance D2c.

Next, referring to FIG. 19B, the second-third assembly substrate structure N2c according to the embodiment can include a second assembly hole 203b formed by patterning a predetermined partition wall 207. The second assembly hole 203b can include a second-first assembly hole 203b1, a second-second assembly hole 203b2, and a second-third assembly hole 203b3.

The second-first assembly hole 203b1 can be located on the third-second protruding electrode 201b2 and the fourth-first protruding electrode 202b1. The second-second assembly hole 203b2 can be located on the third-first protruding electrode 201b1 and the fourth-second protruding electrode 202b2. The second-third assembly hole 203b3 can be located on the third-third protruding electrode 201b3 and the fourth-third protruding electrode 202b3.

At least portions of the second-first assembly hole 203b1, the second-second assembly hole 203b2, and the second-third assembly hole 203b3 can overlap each other.

According to the second-third assembling substrate structure N2c according to the embodiment, there is a technical effect of further increasing the probability of assembling an elliptical semiconductor light emitting device by including at least three assembly holes overlapping each other.

In addition, according to the second-third assembly substrate structure N2c according to the embodiment, by disposing at least three or more protruding electrodes on the third electrode 201b and the fourth electrode 202b to face each other, the distance between the third electrode 201b and the fourth electrode 202b can be designed to be equal to or larger than the diameter of the circular first semiconductor light emitting device. So an area that the circular first semiconductor light emitting device 150R can overlap the third electrode 201b and the fourth electrode 202b can be further reduced.

Through this, even when the circular first semiconductor light emitting device 150R is temporarily positioned on the second-third assembly substrate structure N2c according to the embodiment, the DEP force can be remarkably weak. So, there are multiple technical effects in that the possibility for the first semiconductor light emitting device 150R to interfere with the second semiconductor light emitting device 150G assembling can be significantly reduced, and at the same time the probability of assembling the elliptical semiconductor light emitting device 150G can be significantly increased by including three assembly holes overlapping each other.

The above detailed description should not be construed as limiting in all respects.

It should be considered exemplary. The scope of the embodiments is defined in the appended claims. It should be determined by reasonable interpretation, and all changes within the equivalent scope of the embodiments are included in the scope of the embodiments.

The embodiments can be employed in the field of display for displaying images or information.

The embodiments can be applied to a display field for displaying images or information using a semiconductor light emitting device.

The embodiments can be employed in a display field for displaying images or information using a micro-level or nano-level semiconductor light emitting device.

What is claimed is:

1. An overlapping assembly substrate structure for semiconductor light emitting devices, the overlapping assembly structure comprising:
    a first assembly substrate structure and a second assembly substrate structure disposed spaced apart from each other,
    wherein the first assembly substrate structure comprises a first electrode and a second electrode spaced apart by a first distance and a first partition wall having a circular first assembly hole to accommodate a semiconductor light emitting device having a circular shape, and
    wherein the second assembly substrate structure comprises a third electrode and a fourth electrode spaced apart by a second distance greater than the first distance and a second partition wall having an elliptical second assembly hole to accommodate a semiconductor light emitting device having an elliptical shape.

2. The overlapping assembly substrate structure according to claim 1, wherein the second assembly hole includes a second-first assembly hole and a second-second assembly hole at least partially overlapped with each other.

3. The overlapping assembly substrate structure according to claim 1, wherein the second-first assembly hole and the second-second assembly hole have a first-second width in a long axis direction that is a central axis of the second-second assembly hole and a second-second width in a short axis direction perpendicular to the central axis.

4. The overlapping assembly substrate structure according to claim 3, further comprising a third assembly substrate structure disposed on one side of the second assembly substrate structure,
    wherein the third assembly substrate structure comprises a fifth electrode and a sixth electrode having a third distance greater than the second distance in a vertical distance and a third partition wall having an elliptical third assembly hole.

5. The overlapping assembly substrate structure according to claim 4, wherein the third assembly hole comprises a third-first assembly hole and a third-second assembly hole at least partially overlapping each other.

6. The overlapping assembly substrate structure according to claim 5, wherein the third-first assembly hole and the third-second assembly hole have a first-third width in a long axis direction that is a central axis of the third-second assembly hole and a second-third width in a short axis direction perpendicular to the central axis, and
    wherein the first-third width is greater than the first-second width, and the second-third width is smaller than the second-second width.

7. The overlapping assembly substrate structure according to claim 1, wherein the third electrode comprises a third protruding electrode protruding toward the fourth electrode.

8. The overlapping assembly substrate structure according to claim 7, wherein the third electrode comprises:
    a third electrode body;
    a third-first protruding electrode protruding toward the fourth electrode; and
    a third-second protruding electrode protruding in a direction of the fourth electrode and disposed adjacent to the third-first protruding electrode.

9. The overlapping assembly substrate structure according to claim 8, wherein surfaces of the third-first protruding electrode and the third-second protruding electrode are flat.

10. The overlapping assembly substrate structure according to claim 8, wherein the fourth electrode comprises:
   a fourth electrode body; and
   a fourth-first protruding electrode and a fourth-second protruding electrode protruding in a direction of the third electrode and disposed adjacent to each other.

11. The overlapping assembly substrate structure according to claim 10, wherein surfaces of the fourth-first protruding electrode and the fourth-second protruding electrode are flat.

12. The overlapping assembly substrate structure according to claim 11, wherein the flat surface of the third-first protruding electrode and the flat surface of the fourth-first protruding electrode are parallel to each other.

13. The overlapping assembly substrate structure according to claim 8, wherein the surfaces of the third-first protruding electrode and the third-second protruding electrode of the second assembly substrate structure include a first curvature recess and a third curvature recess concave in the direction of the fourth electrode, respectively.

14. The overlapping assembly substrate structure according to claim 10, wherein surfaces of the fourth-first protruding electrode and the fourth-second protruding electrode include a second curvature recess and a fourth curvature recess concave in a direction of the third electrode, respectively.

15. The overlapping assembly substrate structure according to claim 8, wherein the second assembly substrate structure further comprising a third-third protruding electrode disposed between the third-first protruding electrode and the third-second protruding electrode.

16. An overlapping assembly substrate structure for semiconductor light emitting devices, the overlapping assembly substrate structure comprising:
   a first assembly substrate structure and a second assembly substrate structure disposed spaced apart from each other,
   wherein the first assembly substrate structure comprises a first electrode and a second electrode spaced apart by a first distance and a first partition wall having a circular first assembly hole to accommodate a semiconductor light emitting device having a circular shape,
   wherein the second assembly substrate structure comprises a third electrode and a fourth electrode spaced apart by a second distance greater than the first distance, and
   wherein the third electrode comprises a third protruding electrode protruding toward the fourth electrode.

17. The overlapping assembly substrate structure according to claim 16, wherein the second assembly substrate structure comprises a second partition wall having an elliptical second assembly hole to accommodate a semiconductor light emitting device having an elliptical shape.

18. The overlapping assembly substrate structure according to claim 16, wherein the third electrode comprises:
   a third electrode body;
   a third-first protruding electrode protruding toward the fourth electrode; and
   a third-second protruding electrode protruding in a direction of the fourth electrode and disposed adjacent to the third-first protruding electrode.

19. The overlapping assembly substrate structure according to claim 18, wherein the fourth electrode comprises:
   a fourth electrode body; and
   a fourth-first protruding electrode and a fourth-second protruding electrode protruding in a direction of the third electrode and disposed adjacent to each other.

20. A display device comprising:
   a plurality of semiconductor light emitting devices configured to emit light for displaying images; and the overlapping assembly substrate structure of claim 1 to accommodate the plurality of semiconductor light emitting devices.

* * * * *